United States Patent
Kawashiri

(10) Patent No.: US 9,190,504 B2
(45) Date of Patent: Nov. 17, 2015

(54) SEMICONDUCTOR DEVICE

(71) Applicant: Sanken Electric Co., LTD., Niiza-shi, Saitama (JP)

(72) Inventor: Satoshi Kawashiri, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/491,114

(22) Filed: Sep. 19, 2014

(65) Prior Publication Data

US 2015/0084093 A1    Mar. 26, 2015

(30) Foreign Application Priority Data

Sep. 20, 2013 (JP) .................................. 2013-194834
Jul. 18, 2014 (JP) .................................. 2014-148356
Jul. 30, 2014 (JP) .................................. 2014-155442

(51) Int. Cl.
*H01L 29/73* (2006.01)
*H01L 29/739* (2006.01)
*H01L 29/78* (2006.01)

(52) U.S. Cl.
CPC ......... *H01L 29/7396* (2013.01); *H01L 29/7394* (2013.01); *H01L 29/7395* (2013.01); *H01L 29/7802* (2013.01)

(58) Field of Classification Search
CPC .............. H01L 29/7802; H01L 29/778; H01L 29/7393; H01L 29/7394; H01L 29/735; H01L 29/1969
USPC .................................. 257/330, 333, 139–140
See application file for complete search history.

(56) References Cited

U.S. PATENT DOCUMENTS

| | | | |
|---|---|---|---|
| 5,329,142 A | | 7/1994 | Kitagawa et al. |
| 6,163,051 A | * | 12/2000 | Nakagawa et al. ............ 257/331 |
| 6,331,466 B1 | * | 12/2001 | Takahashi et al. ............ 438/268 |
| 2004/0084722 A1 | * | 5/2004 | Yamaguchi et al. .......... 257/330 |

(Continued)

FOREIGN PATENT DOCUMENTS

| | | |
|---|---|---|
| JP | H05-243561 A | 9/1993 |
| JP | H10-214968 A | 8/1998 |

(Continued)

OTHER PUBLICATIONS

Apr. 20, 2015—(JP) Notification of Reasons for Refusal—App 2014-173752—Eng. Tran.

(Continued)

*Primary Examiner* — Nathan Ha
(74) *Attorney, Agent, or Firm* — Banner & Witcoff, Ltd.

(57) ABSTRACT

A semiconductor device includes: a first semiconductor region; a second semiconductor region; a third semiconductor region; a fourth semiconductor region; an insulation film, which is arranged on an inner wall of a recess extending from an upper surface to the second semiconductor region; a control electrode, which is arranged on a region of the insulation film on a side surface of the recess; a first main electrode connected to the first semiconductor region; a second main electrode connected to the fourth semiconductor region; and a bottom electrode, which is arranged on the insulation film and is electrically connected to the second main electrode, and a length of the recess in an extension direction thereof is equal to or larger than a width of the recess, and the width of the recess is wider than an interval between the adjacent recesses.

13 Claims, 16 Drawing Sheets

(56) References Cited

U.S. PATENT DOCUMENTS

| | | |
|---|---|---|
| 2005/0062101 A1* | 3/2005 | Sugi et al. ............... 257/330 |
| 2005/0263852 A1 | 12/2005 | Ogura et al. |
| 2007/0138547 A1 | 6/2007 | Nakamura |
| 2008/0203535 A1* | 8/2008 | Noda et al. ............... 257/579 |
| 2008/0308839 A1 | 12/2008 | Okada |
| 2009/0072306 A1* | 3/2009 | Izumi ............... 257/333 |
| 2009/0194811 A1 | 8/2009 | Pan et al. |
| 2011/0089485 A1 | 4/2011 | Gao et al. |
| 2012/0068220 A1* | 3/2012 | Kobayashi et al. ......... 257/124 |
| 2012/0217577 A1 | 8/2012 | Hashimoto et al. |
| 2012/0241761 A1 | 9/2012 | Asahara |
| 2013/0001681 A1 | 1/2013 | Sin et al. |
| 2014/0061725 A1* | 3/2014 | Park et al. ............... 257/194 |
| 2014/0070279 A1* | 3/2014 | Briere ............... 257/194 |
| 2014/0197479 A1* | 7/2014 | Um et al. ............... 257/330 |

FOREIGN PATENT DOCUMENTS

| | | |
|---|---|---|
| JP | 2005-340626 A | 12/2005 |
| JP | 2007-165380 A | 6/2007 |
| JP | 2008-311301 A | 12/2008 |
| JP | 2011-040781 A | 2/2011 |
| JP | 2012-178389 A | 9/2012 |
| JP | 2012-204590 A | 10/2012 |
| JP | 2013-508980 A | 3/2013 |
| JP | 2013-524481 A | 6/2013 |
| WO | 2011/148427 A1 | 12/2011 |

OTHER PUBLICATIONS

Sep. 2, 2015—(JP) Office Action—App 2014173752.

* cited by examiner

FIG.3A
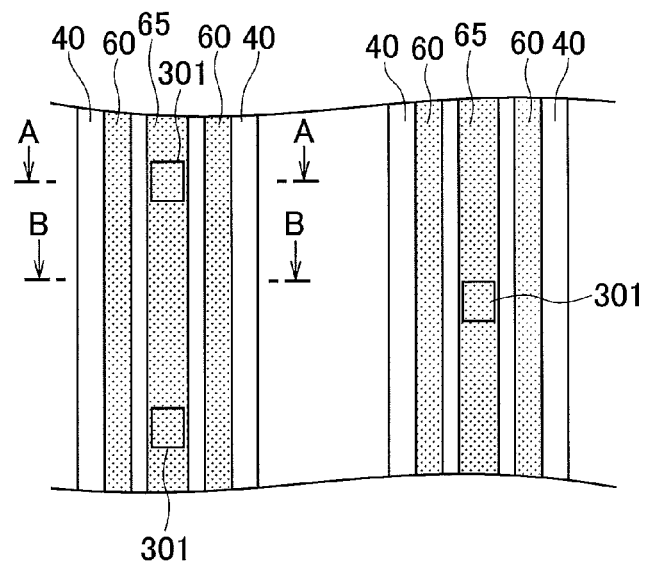
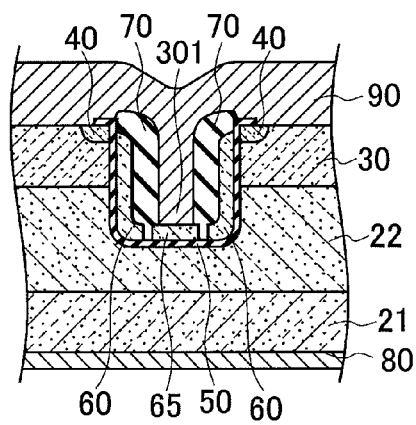
FIG.3B
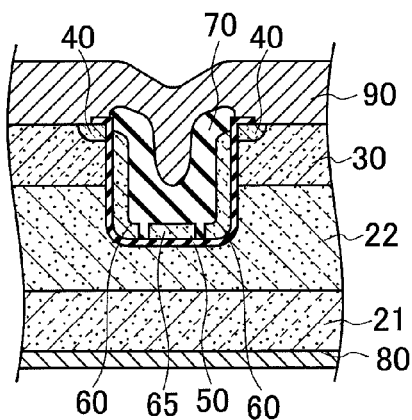
FIG.3C

SEMICONDUCTOR DEVICE

CROSS-REFERENCE TO RELATED APPLICATION

This application claims priority from Japanese Patent Applications No. 2013-194834 filed on Sep. 20, 2013, No. 2014-148356 filed on Jul. 18, 2014, and No. 2014-155442 filed on Jul. 30, 2014, the entire subject matter of which is incorporated herein by reference.

TECHNICAL FIELD

This disclosure relates to a structure of a trench gate-type semiconductor device configured to perform a switching operation.

BACKGROUND

As a switching element (a power semiconductor device) configured to perform a large current switching operation, a power MOSFET, an insulated gate bipolar transistor (IGBT) and the like are used. Regarding the switching element, a trench gate type in which an insulation film and a gate electrode are formed in a recess (trench) formed in a semiconductor substrate is used. In the IGBT, a width of the recess is typically set to about 1 µm or smaller (for example, refer to 2013-524481A).

FIG. 5 is a sectional view illustrating an example of a configuration of a trench gate-type semiconductor device 110. In FIG. 5, an n⁻-type layer 182 and a p⁻-type layer 183 are sequentially formed on an n⁺-type layer 181 to be a drain layer in a semiconductor substrate 180. Recesses 185 penetrating the p⁻-type layer 183 are formed on a front-side of the semiconductor substrate 180. The plurality of recesses 185 (four recesses in a shown range) are formed in parallel to extend in a direction perpendicular to a sheet of FIG. 5. An oxide film 186 is uniformly formed on an inner surface of each recess 185 and a gate electrode 187 is formed to fill in the recess 185.

Also, an n⁺-type layer 188 to be a source region is formed at both sides of the recess 185 on the front-side of the semiconductor substrate 180. A source electrode 189 is formed on the surface of the semiconductor substrate 180. On the other hand, a whole back-side of the semiconductor substrate 180 is formed with a drain electrode 190 with being contacted to the n⁺-type layer 181. In the meantime, since an interlayer insulation film 191 is formed to cover the recess 185 on the front-side of the semiconductor substrate 180, the source electrode 189 is contacted to both the n⁺-type layer 188 and the p⁻-type layer 183 and is insulated from the gate electrode 187. On the front-side beyond the range shown in FIG. 5, all the gate electrodes 187 are connected to a common gate wiring at end portion-sides of the recesses 185 in the extension direction (the direction perpendicular to the sheet). Also, in the range shown in FIG. 5, the source electrode 189 is formed on the entire surface. However, the gate wiring and the source electrode 189 are separated on the front-side. For this reason, for each recess 185, the p⁻-type layer 183 at the sides of the recess 185 is formed with a channel by a voltage applied to the gate wiring (the gate electrode 187), so that the semiconductor device 110 becomes an on-state. That is, it is possible to switch the current between the source electrode 189 and the drain electrode 190 by the voltage applied to the gate electrode 187. Since the channels formed for each recess 185 are connected in parallel, it is possible to supply a large current between the source electrode 189 and the drain electrode 190.

In the meantime, although FIG. 5 illustrates a structure of the power MOSFET, the same structure can be applied to an IGBT. In this case, a structure where a p-type layer (a collector layer) is arranged at a lower layer of the semiconductor substrate 180 and a back-side electrode is contacted to the collector layer may be possible, for example. That is, the back-side electrode functions as a collector electrode.

In order to operate the semiconductor device at high speed, it is necessary to make a feedback capacity Crss and an input capacity Ciss small. In the structure of FIG. 5, the feedback capacity Crss is a capacity between the gate electrode 187 and the drain electrode 190 and the input capacity Ciss is a sum of a capacity between the gate electrode 187 and the source electrode 189 and the feedback capacity Crss. Here, in the structure of FIG. 5, since there is a capacity resulting from the oxide film 186 interposed on a bottom part of the recess 185, it is difficult to make the feedback capacity Crss small. It is obvious that when the oxide film 186 is thickened, the feedback capacity Crss can be made to be small. However, since the other characteristics of the semiconductor device as well as the operating speed also depend on the thickness of the oxide film 186, the thickness of the oxide film 186 is normally set so that a desired characteristic except for the operating speed is obtained. Therefore, contrary to the interlayer insulation film 191, the oxide film 186 is formed to be thin by a thermal oxidation causing an interface characteristic with the semiconductor layers (the p⁻-type layer 183 and the like) to be particularly favorable. In this case, it is difficult to reduce the feedback capacity Crss.

In order to solve the above problems, a structure where the oxide film 186 is particularly thickened only on the bottom part of the recess 185 is considered. Also, a configuration is considered in which the recess 185 is provided on its bottom part with a first semiconductor layer and a first oxide film having the same configuration as the gate electrode 187 and the oxide film 186, respectively, and the gate electrode 187 and the oxide film 186 are formed thereon.

According to the above structures, it is possible to make the feedback capacity Crss small. Meanwhile, in the structures, the oxide film 186 on the p⁻-type layer 183 (the side surface) at the side surface of the recess 185 at which the channel is formed is formed to be thin. Thereby, it is possible to obtain the semiconductor device having the favorable characteristics, in addition to the operating speed.

SUMMARY

However, when adopting the structure where the oxide film 186 is particularly thickened only on the bottom part of the recess, since the oxidation is uniformly progressed during the thermal oxidation process, it is difficult to actually form the insulation film locally thick only on the bottom surface of the recess while keeping the insulation film on the side surfaces of the recess thin. For this reason, in order to form the locally thick insulation film, it is necessary to perform a process of etching the formed insulation film so that it locally remains and again thermally oxidizing the same thereafter or to further repeat the process several times, thereby complicating the manufacturing process. Further, according to the structure where the first semiconductor layer and the first insulation film are provided on the bottom part of the recess and a well-known trench structure is then formed, it is necessary to separately perform a process for forming the structure in the recess, thereby complicating the manufacturing process. As described above, since the manufacturing process becomes complicated, it is difficult to manufacture the semiconductor device at low cost when the above-described structures are adopted. That is, it is difficult to manufacture, at low cost, the trench gate-type semiconductor device of which the feedback capacity Crss is reduced.

Also, the applicant found that an on-resistance can be lowered by widening a width of the recess in the IGBT. However, the feedback capacity Crss is increased in the IGBT having the structure where the width of the recess is widened.

This disclosure provides at least a trench gate-type semiconductor device of which a feedback capacity is reduced and which can be manufactured at low cost.

A semiconductor device of one aspect of this disclosure comprises: a first semiconductor region, which has a first conductivity type; a second semiconductor region, which has a second conductivity type and is arranged on the first semiconductor region; a third semiconductor region, which has the first conductivity type and is arranged on the second semiconductor region; a fourth semiconductor region, which has the second conductivity type and is arranged on the third semiconductor region; an insulation film, which is arranged on an inner wall of a recess extending from an upper surface of the fourth semiconductor region and penetrate the fourth semiconductor region and the third semiconductor region to reach the second semiconductor region; a control electrode, which is arranged on a region of the insulation film on a side surface of the recess, the region facing a side surface of the third semiconductor region; a first main electrode, which is electrically connected to the first semiconductor region; a second main electrode, which is electrically connected to the fourth semiconductor region; and a bottom electrode, which is arranged on the insulation film with being separated from the control electrode on a bottom surface of the recess and is electrically connected to the second main electrode, and a length of the recess in an extension direction thereof is equal to or larger than a width of the recess, and the width of the recess is wider than an interval between the adjacent recesses, as viewed from a plan view.

A semiconductor device of another aspect of this disclosure includes: a first semiconductor region, which has a first conductivity type; a second semiconductor region, which has a second conductivity type and is arranged on the first semiconductor region; a third semiconductor region, which has the first conductivity type and is arranged on the second semiconductor region; a fourth semiconductor region, which has the second conductivity type and is arranged on the third semiconductor region; an insulation film, which is arranged on an inner wall of a recess extending from an upper surface of the fourth semiconductor region and penetrates the fourth semiconductor region and the third semiconductor region to reach the second semiconductor region; a control electrode, which is arranged on a region of the insulation film on a side surface of the recess, the region facing a side surface of the third semiconductor region; a bottom electrode, which is arranged on the insulation film with being separated from the control electrode on a bottom surface of the recess; a first main electrode, which is electrically connected to the first semiconductor region; an interlayer insulation film arranged on the control electrode and the bottom electrode; and a second main electrode, which is arranged on the third semiconductor region and the fourth semiconductor region, above the control electrode and the bottom electrode, with interposing the interlayer insulation film, and electrically connected to the fourth semiconductor region and the bottom electrode, and an area of the recess is larger than an area of a semiconductor region between the adjacent recesses, as viewed from a plan view.

According to this disclosure, it is possible to provide the trench gate-type semiconductor device of which the feedback capacity is reduced and which can be manufactured at low cost.

BRIEF DESCRIPTION OF THE DRAWINGS

The foregoing and additional features and characteristics of this disclosure will become more apparent from the following detailed descriptions considered with the reference to the accompanying drawings, wherein:

FIG. 3A is a plan view, and FIGS. 3B and 3C are sectional views of the semiconductor device according to the first illustrative embodiment of this disclosure;

FIGS. 8A and 8B are simulation results showing as aspect where holes are accumulated in a semiconductor device, in which FIG. 8A shows a case where the width of the recess is 2 μm and FIG. 8B shows a case where the width of the recess is 1 μm;

FIGS. 9A and 9B are simulation results of a potential distribution at the periphery of the recess, in which FIG. 9A shows a case where the width of the recess is 2 μm and FIG. 9B shows a case where the width of the recess is 1 μm;

FIGS. 12A and 12B is schematic views illustrating an arrangement of a gate electrode and a bottom electrode of the semiconductor device according to the second illustrative embodiment of this disclosure, in which FIG. 12A is a plan view and FIG. 12B is a sectional view taken along a direction XIII-XIII of FIG. 12A;

DETAILED DESCRIPTION

Figure 1:
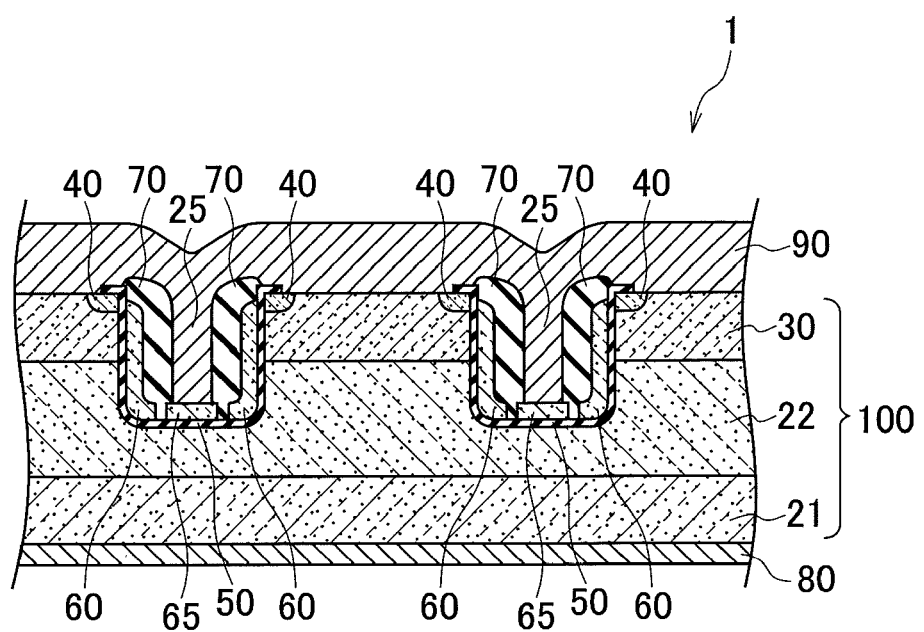
FIG. 1 is a sectional view of a semiconductor device according to a first illustrative embodiment of this disclosure.

In the below, illustrative embodiments of this disclosure will be described with reference to the drawings. In the drawings, the same or similar parts are denoted with the same or similar reference numerals. It should be noted that the drawings are just schematic and a relation between a thickness and a planar size, a ratio of lengths of respective part and the like are different from the actual ones. Therefore, the specific sizes should be determined, considering the below descriptions. Also, the drawings include parts that are different as regards the size relation and ratio of the parts.

Also, the illustrative embodiments described below exemplify an apparatus and a method for embodying the technical spirit of this disclosure, and the technical spirit of this disclosure is not specified to the below descriptions as regards shapes, structures, arrangement and the like of the constitutional components. The illustrative embodiments of this disclosure can be variously changed within the scope of this disclosure.

First Illustrative Embodiment

Hereinafter, a semiconductor device according to a first illustrative embodiment of this disclosure will be described. The semiconductor device is a trench gate-type power MOSFET in which a channel becomes on and off by a gate voltage and the current is thus switched. Gate electrodes are formed in recesses 25 formed in parallel in a surface of a semiconductor substrate, and the respective gate electrodes are connected in parallel. Each gate electrode is formed in the recess 25 after an insulation film is formed on an inner surface of the recess 25.

FIG. 1 is a sectional view illustrating a structure of the semiconductor device 1. The semiconductor device 1 is a trench gate-type device having a configuration where the gate electrodes are formed in the recesses 25 formed in the semiconductor substrate 100. In FIG. 1, an $n^-$-type layer 22 and a $p^-$-type layer 30 are sequentially formed on an $n^+$-type layer 21 to be a drain layer in the semiconductor substrate 100. The recesses 25 penetrating the $p^-$-type layer 30 are formed on a front-side of the semiconductor substrate 100. The plurality of recesses 25 (two recesses in FIG. 1) is formed in parallel to extend in a direction perpendicular to a sheet of FIG. 1. An insulation film 50 is uniformly formed on an inner surface (side and bottom surfaces) of each recess 25. The insulation film 50 may be formed to be thin on the side surfaces of the recess 25 and to be thick on the bottom surface of the recess 25.

An $n^+$-type layer 40 is formed at both sides of the recess 25 on the front-side of the semiconductor substrate 100. A drain electrode (a first main electrode) 80 electrically connected to the $n^+$-type layer (the drain layer) 21 is formed on an entire back-side of the semiconductor substrate 100.

The insulation film 50 is removed on the front-side of the semiconductor substrate 100 apart from the recess 25. FIG. 1 shows the structure where the two recesses 25 are formed in parallel. In the below, a structure corresponding to the single recess 25 is described. The semiconductor device 1 is different from the semiconductor device 110 shown in FIG. 5, as regards the structure in the recess 25, particularly.

First, gate electrodes 60 are respectively provided on the left and right sidewall parts of the recess 25 along the $p^-$-type layer 30 and are separated from side to side on the bottom surface of the recess 25. The left and right gate electrodes 60 are connected at a part (for example, an end portion of the recess 25 in a longitudinal direction) beyond the shown range. The gate electrode 60 is configured by a heavily doped conductive polycrystalline silicon film.

In the meantime, as viewed from the plan view, the bottom surface of the recess 25 is formed with a bottom electrode 65 separated (insulated) from the left and right gate electrodes 60 between the left and right gate electrodes 60, as shown in FIG. 3A. Since the insulation film 50 is formed on the bottom surface of the recess 25, the bottom electrode 65 is insulated from the below $n^-$-type layer 22. At this state, an interlayer insulation film 70 is formed in the recess 25 to cover the left and right gate electrodes 60 and to separate the bottom electrode 65 and the gate electrodes 60 at both sides thereof each other.

At the state, a source electrode (a second main electrode) 90 is formed to cover the surface of the semiconductor substrate 100. By the above configuration, the source electrode 90 is connected to the $p^-$-type layer 30 and the $n^+$-type layer 40 on the surface of the semiconductor substrate 100, like the semiconductor device 110 shown in FIG. 5, and is also connected to the bottom electrode 65 on the bottom surface of the recess 25 by a through-hole formed in the interlayer insulation film 70. By the interlayer insulation film 70, the source electrode 90 and the gate electrode 60 are insulated from each other.

Figure 5:
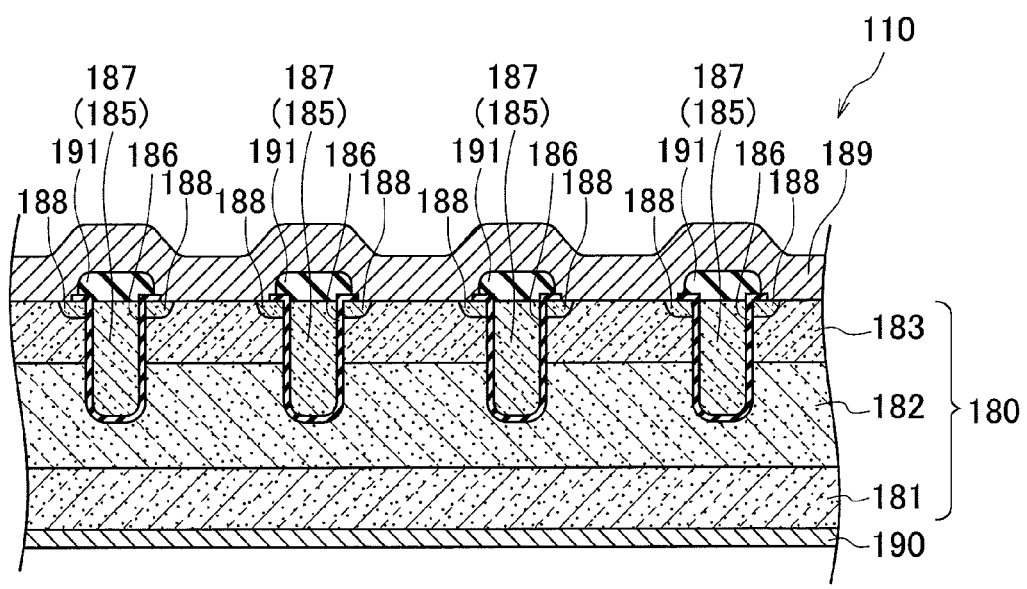
FIG. 5 is a sectional view illustrating a structure of a semiconductor device according to a comparative example.

Like the semiconductor device 110 shown in FIG. 5, all the gate electrodes 60 are connected to a common gate wiring at end portions of the recesses 25 in the extension direction on the front-side. The gate wiring and the source electrode 90 are separated. For this reason, it is possible to control potentials of the source electrode 90, the drain electrode 80 and the gate electrodes 60, thereby switching the current between the source electrode 90 and the drain electrode 80 by a voltage applied to the gate wiring.

In the above structure, the gate electrodes 60 are not formed on the bottom surface of the recess 25 and are separated at both sides thereof, so that a feedback capacity Crss between the gate electrodes 60 and the drain electrode 80 is reduced. Further, since the bottom electrode 65 has the same potential (for example, ground potential) as the source electrode 90, the feedback capacity Crss is reduced.

Also, in a trench gate-type device where the gate electrodes 60 separated from side to side are arranged in the recess 25 without forming the bottom electrode 65, when a width of the recess 25 is wide (for example, a recess width is about 3 to 20

μm), it is difficult for a depletion layer to broaden at the bottom part-side of the recess 25. Therefore, a withstanding voltage is lowered at the corresponding part and a withstanding voltage of the entire device is lowered at the corresponding part, in many cases. In contrast, according to this illustrative embodiment, the bottom electrode 65 is provided between the left and right gate electrodes 60. Thereby, even when the recess 25 is wide, the depletion layer is favorably broadened at the bottom part-side of the recess 25, so that it is possible to increase the withstanding voltage.

Also, in the structure of FIG. 1, since the insulation film 50 is uniformly formed in the recess 25, it is possible to form the insulation film 50 by performing a thermal oxidation one time. Also, it is possible to form the gate electrodes 60 and the bottom electrode 65 at the same time by patterning the same polycrystalline silicon film.

Figure 2A:
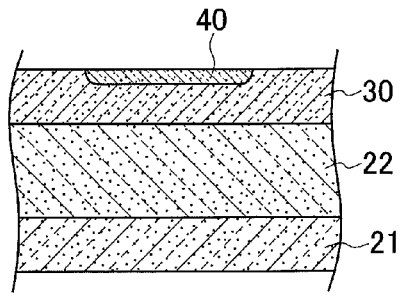
FIGS. 2A-2N are process sectional views illustrating a manufacturing method of the semiconductor device according to the first illustrative embodiment of this disclosure.

In the below, a method of manufacturing the semiconductor device is described in detail. FIGS. 2A to 2N are sectional views illustrating manufacturing processes of the semiconductor device 1. Here, only a structure relating to one recess 25 is shown.

First, as shown in FIG. 2A, regarding the semiconductor substrate 100 having the n⁻-type layer 22 and the p⁻-type layer 30 sequentially formed on the n⁺-type layer 21, the n⁺-type layer 40 wider than the recess 25 is formed in the surface (in the p⁻-type layer 30), in which the recess 25 should be formed, by an ion implantation. In the meantime, at least one of the p⁻-type layer 30 and the n⁺-type layer 40 may be formed after the gate electrodes 60 and the bottom electrode 65 are formed.

Figure 2B:
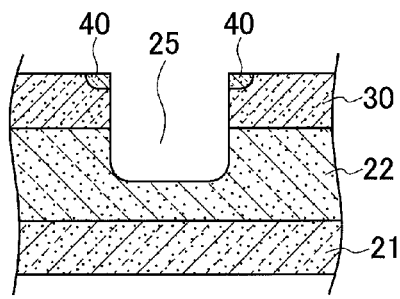

Then, as shown in FIG. 2B, the recess 25 is formed in the region where the n⁺-type layer 40 is formed (a recess formation process). The recess 25 may be formed by dry etching the semiconductor substrate 100 with a photoresist film serving as a mask. The recess 25 is formed to penetrate the p⁻-type layer 30 and to reach the n⁻-type layer 22.

Figure 2C:
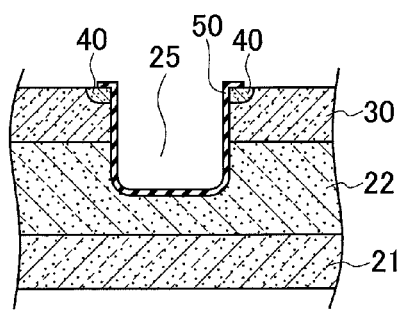

Then, the structure of FIG. 2B is thermally oxidized, so that the insulation film 50 is formed over the entire surface of the semiconductor substrate 100 including the inside of the recess 25 (an oxidation process). Thereafter, the insulation film 50 existing at a region separated from the recess 25 is removed by an etching. Thereby, as shown in FIG. 2C, the insulation film 50 remains only in the recess 25 (the bottom and side surfaces) and the periphery thereof. Here, when a thickness of the insulation film 50 is uniform in the recess 25, the insulation film 50 can be formed by performing the thermal oxidation one time.

Figure 2D:
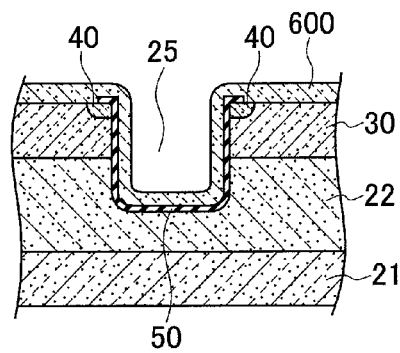

Then, a polycrystalline silicon film (a gate electrode material) 600 heavily doped to have the conductivity is formed on the entire surface by a CVD method (a gate electrode film formation process). At this time, as shown in FIG. 2D, the polycrystalline silicon film 600 is formed at a film formation condition at which the inside of the recess 25 is not plugged up with the polycrystalline silicon film 600 and a thickness of the polycrystalline silicon film 600 is substantially uniform on the side and bottom surfaces of the recess 25.

Figure 2E:
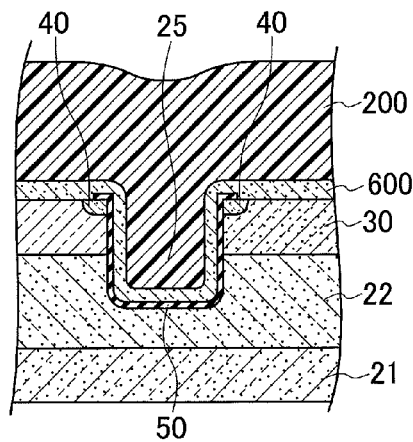
Figure 2F:
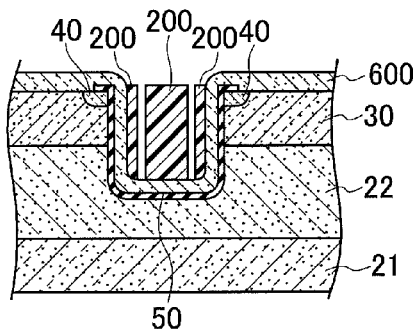

Then, the formed polycrystalline silicon film 600 is patterned (a gate electrode patterning process). FIGS. 2E to 2H illustrate in detail the gate electrode patterning process. First, as shown in FIG. 2E, a photoresist film 200 is formed on the entire surface and is exposed and developed using a mask. Then, as shown in FIG. 2F, the photoresist film 200 is patterned. Here, it is not generally easy to expose and develop the photoresist film 200 including a step portion to thus pattern the same with precision through the top and bottom of the step portion, because a focus depth is limited upon the exposure. However, as shown, only the inside of the recess 25 is patterned. Therefore, when a focus is placed on the bottom surface of the recess 25 upon the exposure, the patterning shown in FIG. 2F can be easily performed.

Figure 2G:
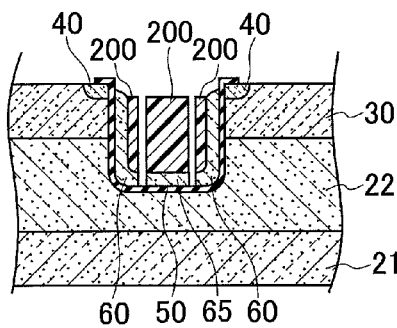
Figure 2H:
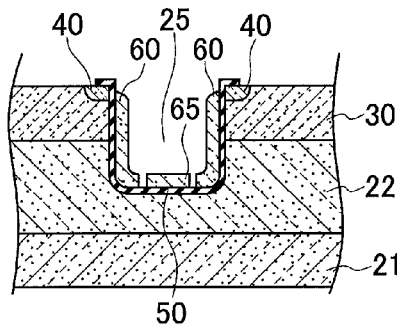

Thereafter, as shown in FIG. 2G, the polycrystalline silicon film 600 is dry etched (anisotropic etching). Thereby, the polycrystalline silicon film 600 in the recess 25 is particularly selectively removed, so that the gate electrodes 60 and the bottom electrode 65 are separated. Then, as shown in FIG. 2H, the photoresist film 200 is removed. Thereby, the gate electrodes 60 and the bottom electrode 65 shown in FIG. 1 are formed. In the meantime, the polycrystalline silicon film 600 is patterned so that a part thereof remains as a wiring material at a side (for example, the end portions of the recess 25 in the extension direction) beyond the shown range.

Figure 2I:
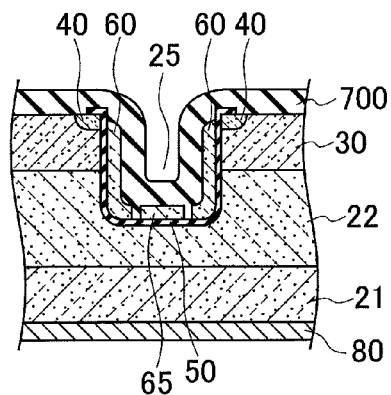

After that, as shown in FIG. 2I, an insulation film 700 is formed on the entire front side (an interlayer insulation film formation process). At this time, the insulation film 700 is formed in the recess 25, like the polycrystalline silicon film 600.

Figure 2J:
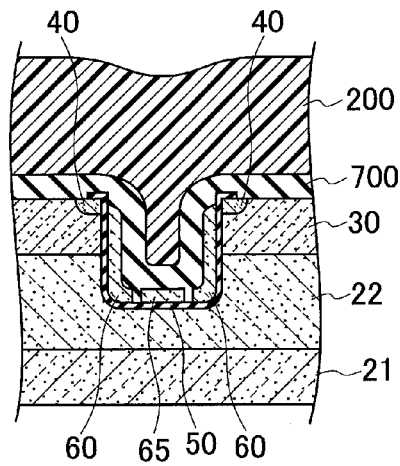
Figure 2K:
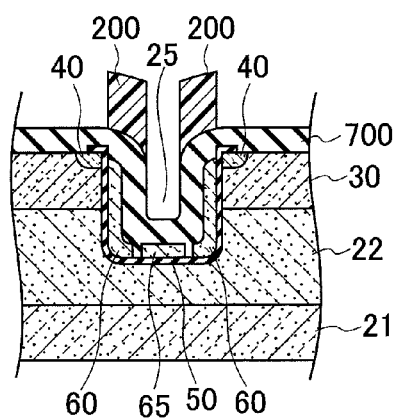
Figure 2I:
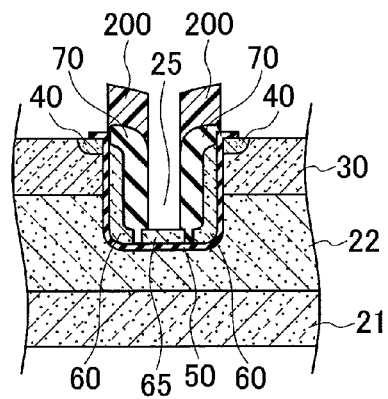

Then, the formed insulation film 700 is patterned (an interlayer insulation film patterning process). FIGS. 2J to 2M illustrate in detail the interlayer insulation film patterning process. First, as shown in FIG. 2J, the photoresist film 200 is formed in the same manner as FIG. 2D. Then, as shown in FIG. 2K, the photoresist film 200 is uniformly patterned so that the insulation film 700 is exposed at the outer side of the recess 25 and on the bottom electrode 65 in the recess 25. Also in this patterning, a part having a small processing line width is the inside of the recess 25. Therefore, it is possible to easily perform the patterning by placing a focus on the bottom surface of the recess 25 upon the exposure.

Figure 2M:
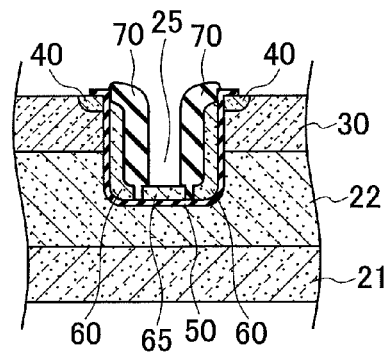
Figure 2N:
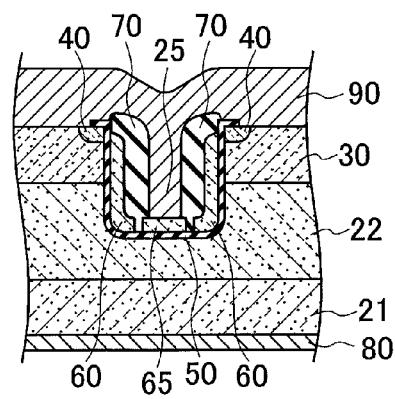

After that, the insulation film 700 is dry etched, so that the insulation film 700 remains as the interlayer insulation film 70, as shown in FIG. 2L. Then, as shown in FIG. 2M, the photoresist film 200 is removed.

Thereafter, as shown in FIG. 2N, the front-side is formed with the source electrode 90 and the back-side is formed with the drain electrode 80 (an electrode formation process), so that the semiconductor device 1 of FIG. 1 is manufactured. Meanwhile, the source electrode 90 is formed on the entire front-side in the region shown in FIG. 2N. Actually, however, the source electrode 90 is not formed on the entire front-side of the semiconductor device 1, contrary to the drain electrode 80. Actually, the recess 25 extends in the direction perpendicular to the sheets of FIGS. 2A to 2N and the gate electrodes 60 are patterned to be taken out from the end portions of the recess on the front-side without contacting the source electrode 90. Thereby, the gate electrodes 60, the source electrode 90 and the drain electrode 80 function as electrode terminals, respectively.

In the configuration of FIG. 1, since the source electrode 90 and the bottom electrode 65 are directly contacted, the bottom electrode 65 has the same potential as the source electrode 90. Here, although the bottom electrode 65 extends in the same manner as the recess 25 in the extension direction of the recess 25, the bottom electrode 65 itself is not a path of the main current. For this reason, it is not required that the source electrode 90 and the thin bottom electrode 65 should uniformly contact each other in the extension direction of the recess 25, and the contact part can be appropriately set.

FIG. 3A is a plan view of the above configuration. Here, the source electrode 90 and the interlayer insulation film 70 are not shown, and an opening 301 of the interlayer insulation film 70 above the bottom electrode 65 is shown. FIG. 3B is a sectional view taken along an A-A direction of FIG. 3A and FIG. 3C is a sectional view taken along an B-B direction of FIG. 3A. In this example, the openings 301 (i.e., the connection portions of the source electrode 90 and the bottom electrodes 65) are arranged in a zigzag shape. However, the openings 301 may not be provided at a central part of a chip and the openings 301 may be provided only at end portions of the chip, for example. This setting may be made by the mask pattern in the interlayer insulation film formation process (FIG. 2K).

Also, in a region where a bonding pad is provided, a surface of the interlayer insulation film 70 in FIG. 3C is preferably flat so as to suppress a crack upon the bonding. In this case, it is preferably to form the interlayer insulation film 70 at a film formation condition causing the surface of the interlayer insulation film 70 to be flat (to be parallel with the surface of the semiconductor substrate 100). In this way, the shape of the interlayer insulation film 70 can be appropriately set inasmuch as the gate electrodes 60 and the bottom electrode 65 can be insulated from each other.

Figure 4:
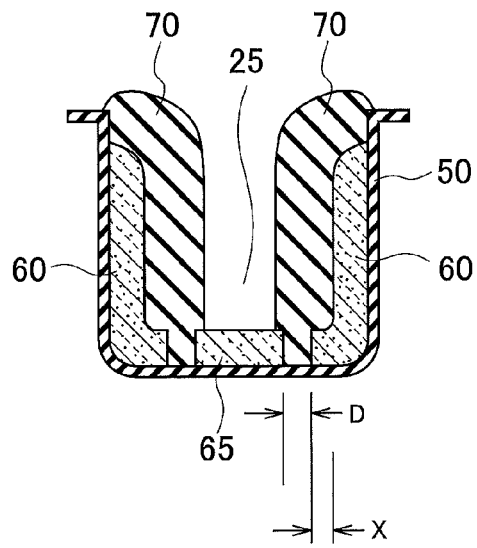
FIG. 4 illustrates a structure in a recess of the semiconductor device according to the first illustrative embodiment of this disclosure.

Subsequently, a positional relation between the gate electrode 60 and the bottom electrode 65 is described. In the configuration of FIG. 1, a positional relation between the gate electrode 60 and the bottom electrode 65 on the bottom surface of the recess 25 influences the characteristics of the semiconductor device 1. FIG. 4 is an enlarged view of the internal structure of the recess 25. An interval between the gate electrode 60 and the bottom electrode 65 is denoted with D and a protrusion amount of the gate electrode 60 towards the bottom electrode 65 in the recess 25 is denoted with X.

A relation between the protrusion amount X and the interval D is described. For example, when a width of the recess 25 and a width of the bottom electrode 65 are constant, it is possible to reduce the feedback capacity Crss by widening the interval D and reducing the protrusion amount X. The reason is that an area of the gate electrode 60 facing the n$^-$-type layer 22 is reduced as the protrusion amount X is reduced.

On the other hand, when the protrusion amount X is increased and the interval D is narrowed, it is possible to improve the withstanding voltage. That is, when the protrusion amount X is increased, since the depletion layer resulting from the potential difference between the gate electrode 60 and the n$^-$-type layer 22 and the depletion layer resulting from the potential difference between the bottom electrode 65 and the n$^-$-type layer 22 are continuously connected, the depletion layer is favorably broadened below the recess 25.

For this reason, it is possible to optimize the withstanding voltage and the feedback capacity Crss by adjusting the protrusion amount X and the interval D. In the meantime, since the protrusion amount X and the interval D can be easily adjusted by a patterning, as described later, the adjusting process is more easily performed, as compared to the related art where the characteristics thereof are adjusted by changing a thickness of the gate oxide film.

According to the above-described structure and manufacturing method, the interval D and the protrusion amount X are all determined by the pattern (the mask pattern of the lithography) of the photoresist film 200 in the gate electrode patterning process (FIG. 2F). For example, when a breakdown occurs between the source electrode 90 and the drain electrode 80 in the power MOSFET, the corresponding part is generally determined so that the breakdown occurs in a specific region on the chip, so as to protect the device. In this case, the mask pattern having the interval D wide in the specific region is used, so that it is possible to easily lower a withstanding voltage of an active region (a cell region) on the chip. On the other hand, when the interval D is narrowed, it is possible to reduce the feedback capacity Crss. That is, it is possible to control distributions of the withstanding voltage and the feedback capacity Crss in a plane of the chip just by the mask pattern of the lithography in the gate electrode patterning process. In the lithography of FIG. 2F, it is possible to control the interval D and the protrusion amount X with high precision by placing the focus on the bottom surface of the recess 25 upon the exposure.

In the meantime, the sectional shape (the etched shape of the polycrystalline silicon film 600 in FIG. 2G) of the bottom electrode 65 can be controlled by a dry etching condition. Thereby, for example, when the bottom electrode 65 is made to have a normal taper shape (a downwardly enlarged shape), it is possible to easily fill in the gaps between the gate electrodes 60 and the bottom electrode 65 with the interlayer insulation film 70 and to secure the favorable insulation therebetween. To the contrary, when the bottom electrode 65 is made to have a reverse taper shape (an upwardly enlarged shape), it is possible to increase a contact area between the source electrode 90 and the bottom electrode 65, thereby reducing a contact resistance therebetween.

In the meantime, as described above, there is a part at which the polycrystalline silicon film 600 remains as the wiring at the outer side (the surface of the semiconductor substrate 100) of the recess 25. However, the wiring pattern is thicker, as compared to the interval D and the protrusion amount X. For this reason, the patterning of the wiring pattern can be easily performed even when the focus is placed on the bottom surface of the recess 25 upon the exposure. That is, as described above, even when the interval D and the protrusion amount X are controlled with high precision, it is possible to easily pattern the polycrystalline silicon film 600 of the semiconductor device 1. In the meantime, also in the interlayer insulation film patterning process, there is a part at which the insulation film 700 remains, in addition to the recess 25. However, since the pattern at the corresponding part is thicker, as compared to the pattern (the opening 301) in the recess 25, the patterning thereof can be also easily performed.

Like this, the semiconductor device 1 can be manufactured by the simple manufacturing process, and the characteristics thereof can be also controlled by the mask pattern upon the lithography.

Since the above structure is formed in the recess 25, the width of the recess 25 is preferably wide in the semiconductor device 1. To this end, the width of the recess 25 is preferably larger than a depth thereof.

In the above example, the bottom electrode 65 is formed between the gate electrodes 60 separated from side to side in the recess 25. However, it is obvious that even when the bottom electrode 65 is not formed, the feedback capacity Crss is reduced. Also in this case, the same manufacturing method can be applied, except for a change in the mask pattern of the lithography in the gate electrode patterning process.

Further, the gate electrodes are not completely separated from side to side in the recess and are formed on the bottom surface of the recess. However, it is obvious that even when an opening is provided for the gate electrode on the bottom surface of the recess, the same effects are accomplished. That is, the above-described effects are accomplished when the gate electrodes are formed on the left and right sidewalls and the gate electrodes are at least partially removed on the bottom surface of the recess. This structure can be manufactured by the same method as the above-described manufacturing method. Even when the bottom electrode insulated from the gate electrode is provided at the partially removed part, the same effects as the above-described bottom electrode are accomplished.

In the above configuration, it is obvious that even when the conductivity types (the p-type and the n-type) are reversed, the same effects are accomplished. It is also obvious that the above-described structure and manufacturing method can be implemented and the same effects are accomplished, irrespective of the materials configuring the semiconductor substrate, the gate electrode and the like.

Meanwhile, in the above descriptions, the semiconductor device is a trench gate-type power MOSFET. However, the same structure can be also applied to the other trench gate-type device such as an IGBT. That is, it is obvious that the same structure can be adopted and the same effects are accomplished for a semiconductor device where a recess is formed in a surface of a semiconductor substrate, a gate electrode contacting an insulation film formed on an inner surface of the recess is provided and an operating current flowing between a first main electrode formed on a back-side of the semiconductor substrate and a second main electrode formed on the surface thereof is switching-controlled by a voltage applied to the gate electrode.

Second Illustrative Embodiment

In the above structure, an IGBT having the recess 25 having a wide width of 3 to 20 μm is particularly preferable because the holes are accumulated in the bottom part of the recess 25 and an on-voltage can be thus lowered. Also, it is possible to further reduce the feedback capacity Crss because it is possible to reduce the number of the gate electrodes.

Figure 6:
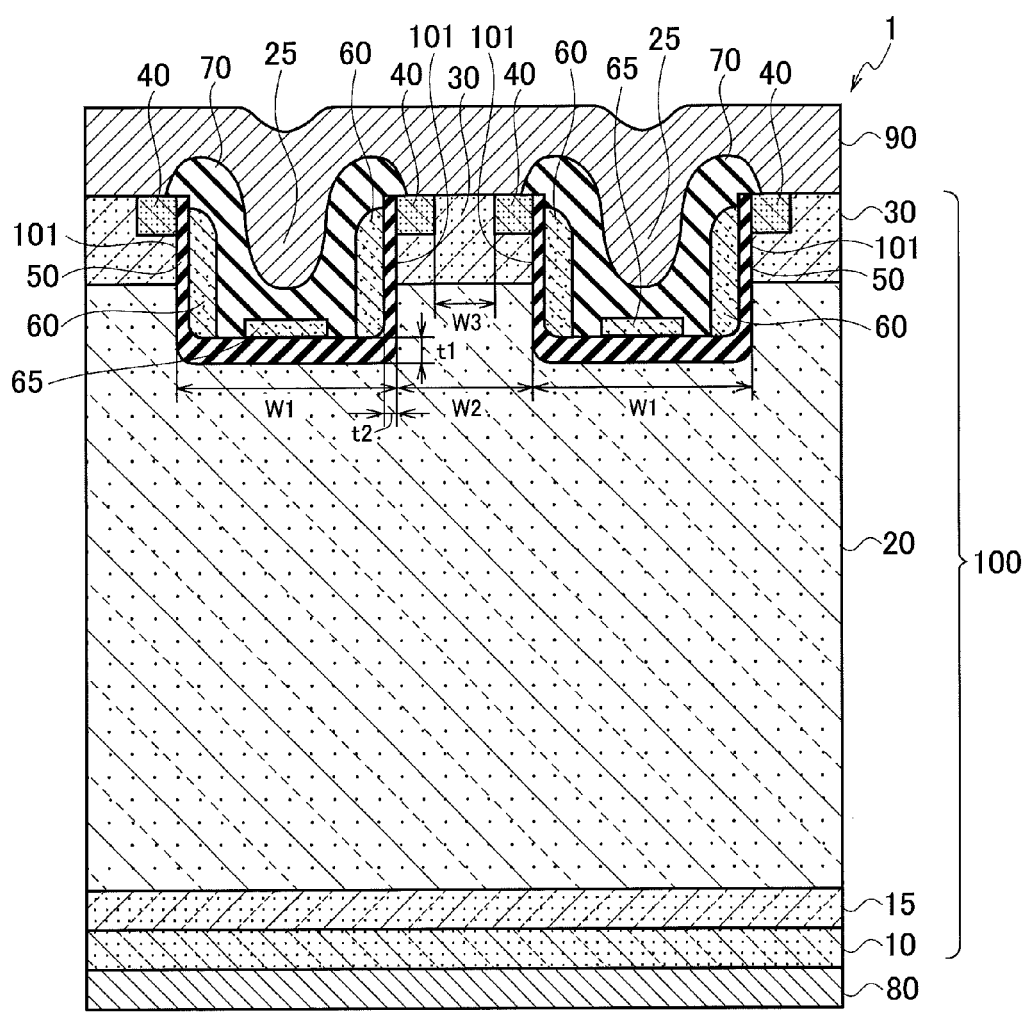
FIG. 6 is a schematic sectional view illustrating a structure of a semiconductor device according to a second illustrative embodiment of this disclosure.

According to a semiconductor device 1 of a second illustrative embodiment of this disclosure, as shown in FIG. 6, a semiconductor substrate 100 has a first semiconductor region 10 of a first conductivity type, a second semiconductor region 20 of a second conductivity type arranged on the first semiconductor region 10, a third semiconductor region 30 of the first conductivity type and fourth semiconductor regions 40 of the second conductivity type separated from each other on the third semiconductor region 30.

As shown in FIG. 6, recesses 25 are formed which extend from upper surfaces of the fourth semiconductor regions 40, penetrate the fourth semiconductor regions 40 and the third semiconductor region 30 and reach the second semiconductor region 20. An insulation film 50 is arranged on an inner wall of the recess 25. On the wall surface of the recess 25, control electrodes 60 are arranged on the insulation film 50 with facing side surfaces of the third semiconductor region 30. Also, a bottom electrode 65 is arranged on a bottom surface of the recess 25 with being separated from the control electrodes 60. The semiconductor device 1 is further provided with a first main electrode 80 electrically connected to the first semiconductor region 10 and a second main electrode 90 electrically connected to the third semiconductor region 30 and the fourth semiconductor regions 40. In the meantime, the second main electrode 90 may not be electrically connected to the third semiconductor region 30. The bottom electrode 65 is electrically connected to the second main electrode 90.

The first conductivity type and the second conductivity type are opposite conductivity types. That is, when the first conductivity type is an n-type, the second conductivity type is a p-type, and when the first conductivity type is a p-type, the second conductivity type is an n-type. In the below, a configuration where the first conductivity type is a p-type and the second conductivity type is an n-type is exemplified.

As described above, the semiconductor device 1 shown in FIG. 6 is a trench gate-type IGBT. In order to easily understand the descriptions, the first semiconductor region 10 is referred to as a p-type collector region 10, the second semiconductor region 20 is referred to as an n-type drift region 20, the third semiconductor region 30 is referred to as a p-type base region 30 and the fourth semiconductor region 40 is referred to as an n-type emitter region 40. A plurality of the emitter regions 40 is selectively filled in parts of the upper surface of the base region 30. Also, the control electrode 60 is referred to as a gate electrode 60, the first main electrode 80 is referred to as a collector electrode 80 and the second main electrode 90 is referred to as an emitter electrode 90. A surface of the base region 30 facing the gate electrode 60 is a channel region 101. That is, a region of the insulation film 50 formed on the side surface of the recess 25 functions as a gate insulation film.

In the semiconductor substrate, impurity concentrations and thicknesses of the respective semiconductor regions are exemplified as follows. When a width W1 of the recess 25 is set to 3 μm to 15 μm and a depth of the recess 25 is set to 2 μm to 10 μm, a thickness of the emitter region 40 is about 0.3 μm or greater and 1 μm or less and an impurity concentration of the emitter region 40 is about $1\times10^{18}$ cm$^{-3}$ to $1\times10^{20}$ cm$^{-3}$. Also, a thickness of the base region 30 is about 4 μm and an impurity concentration of the base region 30 is about $5\times10^{16}$ cm$^{-3}$ to $1\times10^{18}$ cm$^{-3}$. Also, a thickness of the drift region 20 is 40 μm or greater and 140 μm or less and a specific resistance of the drift region 20 is preferably 10 Ωcm or greater and 150 Ωcm or less. Also, a thickness of the collector region 10 is 1 μm to 300 μm and an impurity concentration of the collector region 10 is about $1\times10^{17}$ cm$^{-3}$ to $1\times10^{19}$ cm$^{-3}$.

In the semiconductor device 1 shown in FIG. 6, the width W1 of the recess 25 is larger than an interval W2 between the adjacent recesses 25. The width W1 of the recess 25 indicates a width of the recess 25 at a position of a part contacting a lower surface of the base region 30, i.e., an interface between the base region 30 and the drift region 20. The interval W2 between the recesses 25 means a width of the semiconductor region between the recesses 25. Also, a width (creeping distance) of the base region 30 contacting the emitter electrode 90 between the recesses 25, which is denoted with a width W3 in FIG. 6, is referred to as a 'connection region width'.

An interlayer insulation film 70 is arranged on the upper surfaces of the gate electrodes 60. The emitter electrode 90 connected to the base region 30 and the emitter region 40 is arranged above the gate electrode 60 with the interlayer insulation film 70 being interposed therebetween. By the interlayer insulation film 70, the gate electrode 60 and the emitter electrode 90 are electrically insulated from each other. In the recess 25, the gate electrodes 60 and the bottom electrode 65 are electrically insulated from each other by the interlayer insulation film 70.

Meanwhile, in the example of FIG. 6, an n-type buffer layer 15 is arranged between the drift region 20 and the collector region 10.

Here, operations of the semiconductor device 1 shown in FIG. 6 are described. A predetermined collector voltage is applied between the emitter electrode 90 and the collector electrode 80 and a predetermined gate voltage is applied between the emitter electrode 90 and the gate electrode 60. For example, the collector voltage is about 300V to 1,600V and the gate voltage is about 10V to 20V. When the semiconductor device 1 becomes an on-state in this way, the conductivity type is reversed from the p-type to the n-type in the channel region 101, so that a channel is formed. The electrons pass through the formed channel and are then injected into the drift region 20. By the injected electrons, a forward bias is formed between the collector region 10 and the drift region 20, so that the holes are moved from the collector region 10 in order of the drift region 20 and the base region 30. When the current is further increased, the holes from the collector region 10 are increased and the holes are accumulated below the base region 30. As a result, the on-voltage is lowered by the conductivity modulation.

When switching the semiconductor device 1 from an on-state to an off-state, a gate voltage is lowered below a threshold voltage, so that the gate voltage is controlled to have the same potential as an emitter voltage or a negative potential and the channel region 101 is thus removed. Thereby, the injection of the electrons from the emitter electrode 90 to the drift region 20 is stopped. Since the potential of the collector electrode 80 is higher than the emitter electrode 90, the depletion layer is broadened from the interface between the base region 30 and the drift region 20 and the holes accumulated in the drift region 20 are moved to the emitter electrode 90.

At this time, the holes passes through the semiconductor region between the adjacent recesses 25 having the gate electrodes 60 formed therein. That is, the region between the recesses 25 is an ejection port of the holes.

Figure 7:
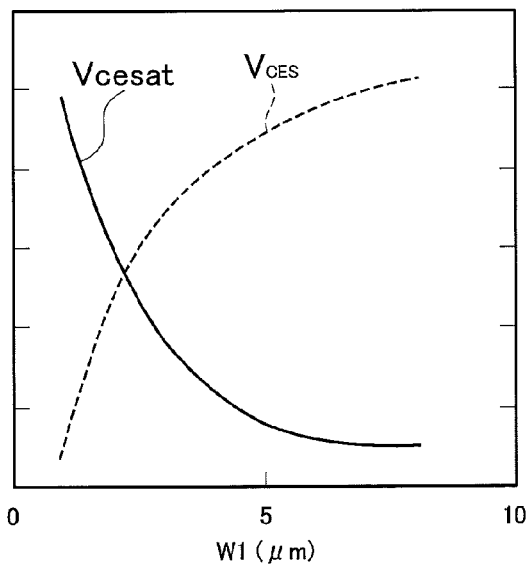
FIG. 7 is a graph showing a relation of a width of a recess of the semiconductor device according to the second illustrative embodiment of this disclosure and a voltage between a collector and an emitter and a saturation voltage between the collector and the emitter.

FIG. 7 shows a relation of the width W1 of the recess 25 of the semiconductor device 1 and a voltage $V_{CES}$ between a collector and an emitter upon a short between a gate and the emitter and a saturation voltage $V_{cesat}$ between the collector and the emitter. The saturation voltage $V_{cesat}$ between the collector and the emitter corresponds to the on-voltage. In the meantime, the interval W2 between the recesses 25 and the connection region width are set to be constant. The lower saturation voltage $V_{cesat}$ between the collector and the emitter is preferable and the higher voltage $V_{CES}$ between the collector and the emitter is preferable. It can be seen from FIG. 7 that the on-voltage is lowered as the width W1 of the recess 25 is widened. The reason is described below.

When a predetermined collector voltage is applied between the emitter electrode 90 and the collector electrode 80 and a predetermined gate voltage is applied between the emitter electrode 90 and the gate electrode 60, so that the semiconductor device 1 becomes an on-state, the channel region 101 is reversed from the p-type to the n-type and a channel is thus formed. The electrons passing through the formed channel and mainly moving from the emitter electrode 90 along the side surfaces of the recess 25 are injected to the drift region 20. By the injected electrons, a forward bias is formed between the collector region 10 and the drift region 20, so that the holes are moved from the collector region 10 to the drift region 20. In the meantime, the thickness of the drift region 20 below the bottom part of the recess 25 is sufficiently larger, as compared to the width W1 of the recess 25. For this reason, even when the width W1 of the recess 25 is widened, the electrons moving along the recess 25 are spread in the drift region 20 in a deeper region than the recess 25. Thereby, not only the interface between the collector region 10 and the drift region 20 just below the region between the recesses 25 but also the interface between the collector region 10 and the drift region 20 in the wider range becomes the forward bias, so that the holes are moved from the collector region 10 to the drift region 20.

The holes moved from the collector region 10 are hindered from moving by the bottom part of the recess 25 and the holes are accumulated in the drift region 20 in the vicinity of the bottom part of the recess 25, so that the conductivity is modulated. The wider the width W1 of the recess 25, the holes are more likely to be accumulated in the drift region 20 in the vicinity of the bottom part of the recess 25. For this reason, according to the semiconductor device 1 in which the width W1 of the recess 25 is wide, it is possible to reduce the on-voltage without arranging a carrier accumulation layer. It can be seen from FIG. 7 that when the width W1 of the recess 25 is about 7 μm, the on-voltage is most efficiently reduced.

Meanwhile, in a general semiconductor device, the width W1 of the recess 25 is about 1 μm to 2 μm even if it is wide.

Also, the width W3 of the connection region width of the base region 30 contacting the emitter electrode 90 is a length of a part through which the holes are moved to the base region 30 and the emitter electrode 90. Since the width W3 is sufficiently narrower than the width W1, an amount of the holes moving to the emitter electrode 90 is reduced and the holes are accumulated in the drift region 20 in the vicinity of the bottom part of the recess 25.

Figure 8A:
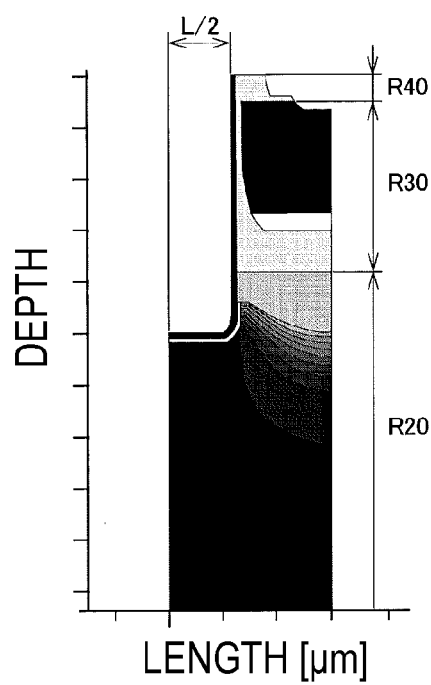
Figure 8B:
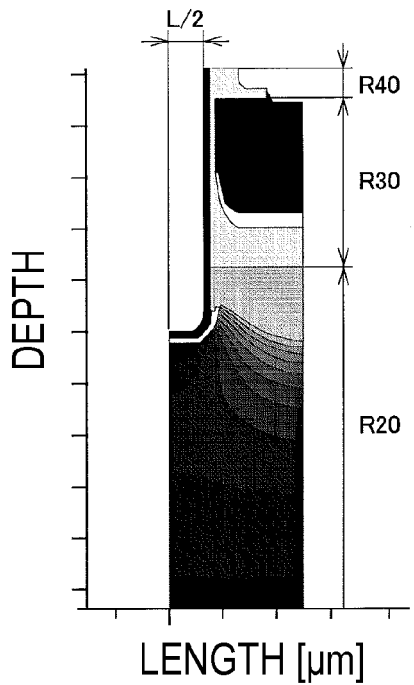

FIG. 8A is a simulation result showing an accumulation aspect of the holes when the length L of the bottom surface of the recess 25 is 2 μm. For reference, FIG. 8B is a simulation result obtained when the bottom surface of the recess 25 is narrower than FIG. 8A. That is, FIG. 8B is a simulation result obtained when the bottom surface of the recess 25 is 1 μm. In FIGS. 8A and 8B, a horizontal axis indicates a length of the bottom surface of the recess 25 in the extension direction thereof and a vertical axis indicates a depth from a surface (an opening) of the recess 25. In the meantime, a region R20 indicates a position of the drift region 20, a region R30 indicates a position of the base region 30 and a region R40 indicates a position of the emitter region 40. A region in which a density of the accumulated holes is higher is shown to be darker. That is, the holes are accumulated in the drift region in the vicinity of the bottom part of the recess 25, and particularly, the holes are accumulated in the region below the bottom part of the recess 25. The on-resistance is lowered by the conductivity modulation resulting from the accumulation of the holes. However, as shown in FIGS. 8A and 8B, when the length of the bottom surface of the recess 25 is 2 μm, the density of the holes accumulated below the outer side of the bottom part of the recess 25 is higher, as compared to the configuration where the length of the bottom surface of the recess 25 is 1 μm. Therefore, the on-voltage is lower when the width W1 of the recess 25 is wider.

On the other hand, when the interval W2 is wide, an amount of the holes moving to the base region 30 without being accumulated below the base region 30 is increased or the chip area is increased. Therefore, it is preferable that the width W1 of the recess 25 is larger than the interval W2 so as to lower the on-voltage.

Also, as shown in FIG. 7, when the width W1 of the recess 25 is widened, it is possible to improve the withstanding voltage of the semiconductor device 1. The reason is described below.

When the semiconductor device 1 is switched from the on-state to the off-state, the depletion layer is broadened in the drift region 20 from the periphery of the bottom part of the recess 25 as well as from a PN junction interface-side with the base region 30. At this time, it is preferable that the depletion layer is uniformly broadened and is broadened more extensively. When the depletion layer is non-uniformly broadened or is broadened in a narrow range, the withstanding voltage is lowered. When the width W1 of the recess 25 is narrow, since a distance between both end portions of the bottom surface of the recess 25, at which an electric field is concentrated, is short, the depletion layer is not broadened favorably uniformly and extensively just below the bottom surface of the recess 25. However, when the width W1 of the recess 25 is wide, since the distance between both end portions of the bottom surface of the recess 25 is wide, the depletion layer is broadened more uniformly or more extensively just below the bottom part of the recess 25. For this reason, the withstanding voltage is improved in the semiconductor device 1 in which the width of the bottom part of the recess 25 is wide.

Figure 9A:
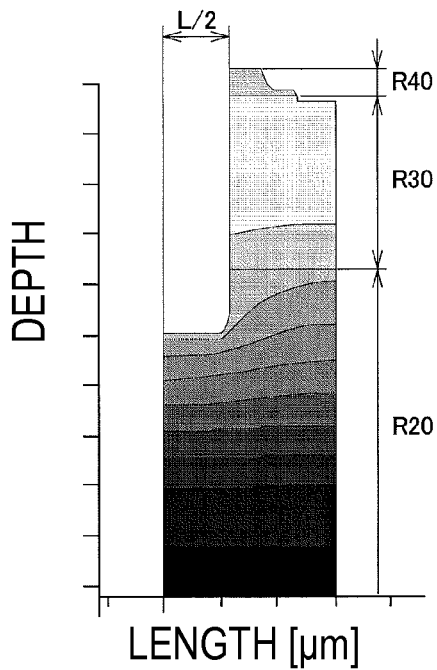
Figure 9B:
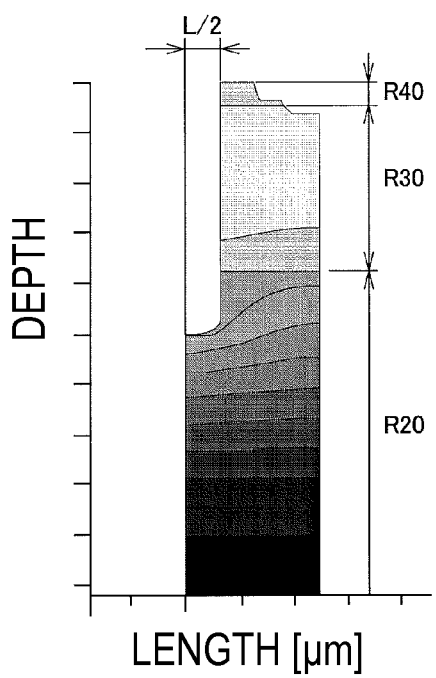

Simulation results of a potential distribution are shown in FIGS. 9A and 9B. FIG. 9A is a simulation result obtained when a length L of the bottom surface of the recess 25 is 2 μm, and FIG. 9B is a simulation result obtained when the length L of the bottom surface of the recess 25 is 1 μm. In FIGS. 9A and 9B, a vertical axis indicates a depth from the surface of the recess 25. In the meantime, the region R20 indicates a position of the drift region 20, the region R30 indicates a position of the base region 30 and the region R40 indicates a position of the emitter region 40. A region in which the potential is higher is shown to be darker. It can be seen from FIGS. 9A and 9B that the depletion layer is broadened downwardly just below the recess 25. In particular, it is confirmed from the simulations that as the bottom surface of the recess 25 is lengthened, the potential distribution below the recess 25 is wider and flatter and the electric field is difficult to be concentrated.

Further, since the interval W2 is relatively narrow, the withstanding voltage of the semiconductor device 1 is improved. A depth of the depletion layer between the recesses 25 is shallower than that of the depletion layer just below the recess 25. When the interval W2 between the recess 25 and the recess 25 is wide, the depletion layer broadening from the PN junction with the base region 30 in the region between the recesses 25 becomes flatter. For this reason, a part at which the depletion layer below the bottom surface of the recess 25 continues to the depletion layer broadening from the side of the recess 25 is more distorted. As a result, the electric field is concentrated in the vicinity of the end portions of the bottom surface of the recess 25, which are the distorted portions of the depletion layer, so that the withstanding voltage is lowered. Therefore, the interval W2 is preferably narrow somewhat and the interval W2 is set to be equal to or less than the width W1 of the recess 25. At this time, the width W1 of the recess 25 may be larger than the depth of the recess 25.

Figure 10:
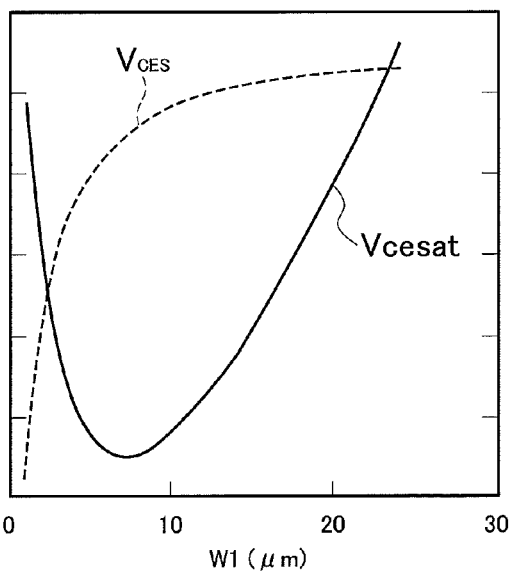
FIG. 10 is another graph showing a relation of the width of the recess of the semiconductor device according to the second illustrative embodiment of this disclosure and the voltage between the collector and the emitter and the saturation voltage between the collector and the emitter.

In the meantime, there are limitations on the chip area. Therefore, when the width W1 of the recess 25 is widened at a state where the chip size is constant, the number of channels is reduced. For example, when the width W1 exceeds the six times of the width W3, the effect of increasing the on-voltage due to the reduction in the number of channels is greater than the effect of lowering the on-voltage due to the conductivity modulation resulting from the accumulation of the holes, so that the on-voltage of the semiconductor device is increased. That is, as shown in FIG. 10, when the width W1 of the recess 25 is widened, a ratio of the channel region 101 occupying the chip size of the semiconductor device is decreased, so that the saturation voltage $V_{cesat}$ between the collector and the emitter is increased. Therefore, the width W1 of the recess 25 formed in the semiconductor device 1 is preferably about 3 μm to 20 μm.

Figure 11:
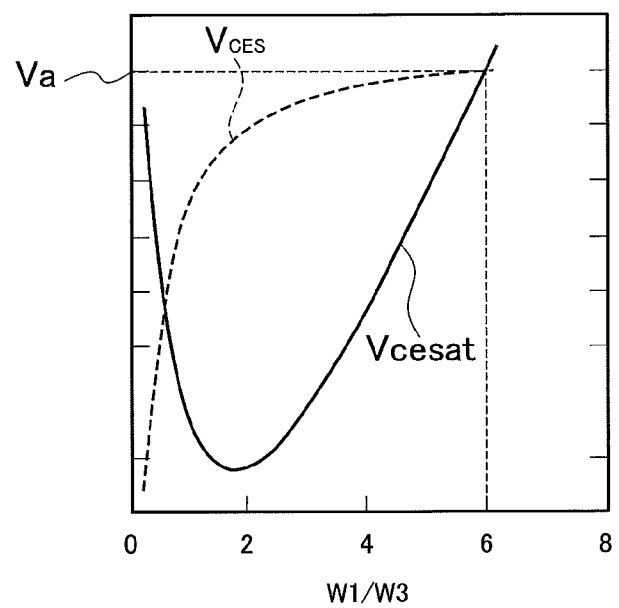
FIG. 11 is a graph showing a relation of a ratio of the width of the recess to a width of a base region of the semiconductor device according to the second illustrative embodiment of this disclosure contacting an emitter electrode and a voltage $V_{CES}$ between the collector and the emitter and a saturation voltage $V_{cesat}$ between the collector and the emitter.

FIG. 11 shows a relation of a ratio W1/W3 of the width W1 of the recess 25 to the width W3 of the connection region width and the voltage $V_{CES}$ between the collector and the emitter upon the short between the gate and the emitter and the saturation voltage $V_{cesat}$ between the collector and the emitter. As already described, the saturation voltage $V_{cesat}$ between the collector and the emitter corresponds to the on-voltage. The saturation voltage $V_{cesat}$ between the collector and the emitter of the related art shown with a voltage value Va in FIG. 11 is a value at the ratio W1/W3 (=6). In order to lower the on-voltage of the semiconductor device 1, the width W3 of the connection region width and the width W1 of the recess 25 preferably satisfy a relation of a following equation (1).

$$1 \leq W1/W3 \leq 6 \quad (1)$$

When the ratio W1/W3 of the width W1 to the width W3 is set to be 1 or larger and 6 or smaller, as shown in the equation (1), it is possible to lower the on-voltage.

As described above, the width W3 of the connection region width requires a somewhat area, from standpoints of the on-voltage and the withstanding voltage. When the ratio W1/W3 exceeds the upper limit of the equation (1), the total number of the channels is reduced, so that the on-voltage is increased. However, the width W1 of the recess 25 is wider than the related art, so that it is possible to lower the on-voltage. Also, the number of the recesses 25 is reduced within the range in which the width W3 and the width W1 satisfy the equation (1). Thereby, the total number of the channels is reduced and a parasitic capacitance between the gate electrode 60 and the semiconductor layer on the side surfaces of the recess 25 can be reduced. Thus, the semiconductor device 1 can operate at high speed.

Also, the width W1 of the recess 25 is widened and the number of the recesses 25 is reduced, so that the total number of the channels is reduced and the channel resistance is increased. For this reason, the current flowing through the semiconductor device 1 upon the load short is limited. That is, according to the semiconductor device 1, it is possible to secure a short circuit capacity.

In the meantime, in order to lower the on-voltage of the semiconductor device 1, the width W3 of the connection region width and the width W1 of the recess 25 satisfy a relation of a following equation (2), more preferably.

$$1.5 \leq W1/W3 \leq 5 \quad (2)$$

More preferably, the width W3 and the width W1 satisfy a relation of a following equation (3).

$$1.7 \leq W1/W3 \leq 2 \quad (3)$$

As shown in FIG. 11, the on-voltage is lowest when the width W3 of the connection region width and the width W1 of the recess 25 satisfy the relation of the equation (3).

As described above, according to the semiconductor device 1 of the second illustrative embodiment, the width W1 of the recess 25 is set to be about 3 μm to 20 μm, more preferably about 5 μm to 13 μm, and the ratio of the width W1 of the recess 25 to the contact width of the base region 30 contacting the emitter electrode 90 is set to be about 1 to 6, more preferably, 1.5 to 5. In this way, the area of the bottom surface of the recess 25 is increased to suppress the movement of the holes at the bottom part of the recess 25. Further, the contact width of the base region 30 contacting the emitter electrode 90 is narrowed to accumulate the holes in the drift region 20 in the vicinity of the bottom part of the recess 25. Also, the interval between the recesses 25 is narrowed to suppress the movement of the holes in the corresponding region. As a result, the holes are accumulated in the drift region in the vicinity of the bottom part of the recess 25 to increase the effect of the distinctive conductivity modulation of the IGBT, so that the on-resistance can be lowered.

In particular, according to the semiconductor device 1 shown in FIG. 6, the holes are attracted by the bottom electrode 65 electrically connected to the emitter electrode 90, so that the holes are likely to be accumulated in the bottom part of the recess 25. For this reason, the holes are more accumulated in the drift region 20. Therefore, the effect of the conductivity modulation is promoted, so that the on-resistance can be further lowered.

Also, according to the semiconductor device 1, the gate electrodes 60 are separated in the recess 25. The gate electrodes 60 are separated, so that the parasitic capacitance Cdg between the drift region 20 below the bottom part of the recess 25 and the gate electrodes 60 is reduced and the high-speed switching is possible. A width d1 of the gate electrode 60 to the width W1 of the recess 25 is about 1/20 to 1/3, more preferably 1/15 to 1/5. The gate electrode 60 consists of a polycrystalline silicon film, for example. The width W1 of the recess 25 is wider, as compared to the related art, so that a gate resistance is lowered. Thereby, it is possible to accomplish the uniform device operation in the same chip.

Meanwhile, as shown in FIG. 6, the insulation film 50 is preferably formed so that a film thickness t1 of the region thereof arranged on the bottom surface of the recess 25 is thicker than a film thickness t2 of the region arranged on the side surfaces of the recess 25 and facing the base region 30. In the semiconductor device 1, the width W1 of the recess 25 in which the gate electrodes 60 are formed is wide, so that the parasitic capacitance Cdg occurring between the gate electrode 60 on the bottom front-side of the recess 25 and the semiconductor region tends to increase. However, it is possible to reduce the parasitic capacitance Cdg by thickening the insulation film 50 on the bottom surface of the recess 25.

Also, as described above, since both end portions of the bottom surface of the recess 25 are the electric field concentration points, the insulation film 50 is preferably formed to have a gentle curved surface at both end portions of the bottom surface of the recess 25, as shown in FIG. 6. Also, the film thickness of the insulation film at both end portions of the bottom surface of the recess 25 may be formed to be thicker than the film thickness t1 of the region arranged on the bottom surface of the recess 25 or the film thickness t2 of the region arranged on the side surface of the recess 25 and facing the base region 30. For example, the film thickness t2 may be formed to gradually thicken towards the bottom surface of the recess 25 in the vicinity of both end portions of the bottom surface of the recess 25.

Since the side surfaces of the insulation film 50 function as a gate insulation film, there is a limitation on the thickening of the side surfaces of the insulation film 50. For this reason, it is preferably to thicken the bottom front-side of the insulation film 50, as compared to the side front-side of the insulation film 50. The film thickness t1 of the insulation film 50 on the bottom surface of the recess 25 is about 300 nm, for example, and the film thickness t2 thereof on the side surface of the recess 25 is about 150 nm, for example.

Figure 12A:
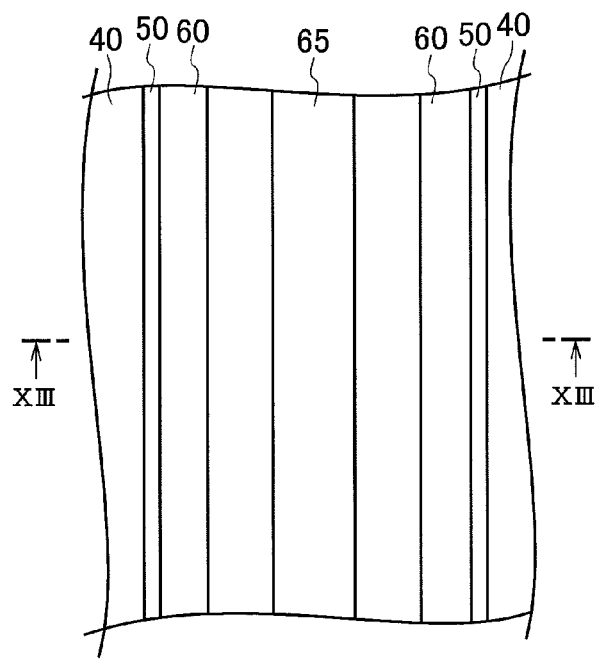
Figure 12B:
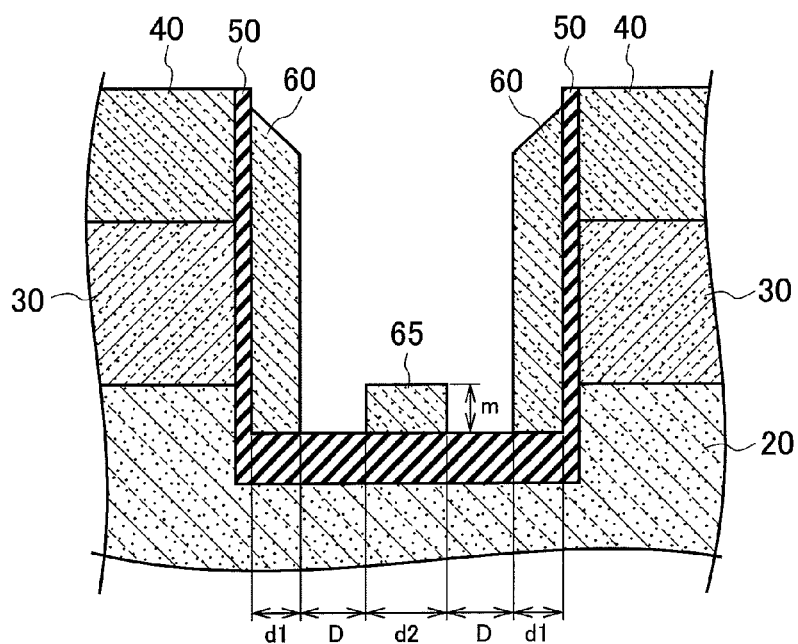

Also, as shown in FIGS. 12A and 12B, the width d2 of the bottom electrode 65 is preferably wider than the width d1 of the gate electrode 60 in the region facing the bottom surface of the recess 25. The reason is described below.

In the semiconductor device 1 where the width W1 of the recess 25 is wider than the interval W2 between the recesses 25, as shown in FIG. 6, it is possible to effectively accumulate the holes in the bottom part of the wide recess 25. Therefore, it is possible to lower the on-resistance by generating the distinctive conductivity modulation of the IGBT. However, if the wide recess 25 is plugged up with the gate electrode 60, the feedback capacity Crss is remarkably increased. In contrast, when the width d2 of the bottom electrode 65 not influencing the feedback capacity Crss is made to be larger than the width d1 of the gate electrode 60, it is possible to suppress the remarkable increase in the feedback capacity Crss. Also, the depletion layer is broadened from the bottom part of the recess 25 towards the semiconductor region-side by the potential difference between the bottom electrode 65 and the collector region 10, so that it is possible to secure substantially the same withstanding voltage as the configuration where the recess 25 is plugged up with the gate electrode 60.

Further, the bottom electrode 65 is electrically connected to the emitter electrode 90, so that the holes are relatively easily collected in the drift region 20 just below the bottom electrode 65 and in the vicinity thereof. For this reason, it is possible to accumulate the holes in the bottom part of the wide recess 25. Thereby, it is possible to further generate the distinctive conductivity modulation of the IGBT, thereby lowering the on-voltage.

Also, the wide recess 25 is formed, so that the number of the recesses 25 occupying the chip size is reduced, the facing area between the gate electrode 60 and the drift region 20 is reduced and the feedback capacity Crss can be thus reduced. Further, when the number of the recesses 25 occupying the chip size is reduced, an area of the emitter region 40 facing the gate electrode 60, which occupies the chip size, is also reduced, so that the input capacity Ciss (=Cgd+Cgs) can be also reduced.

In the meantime, the width d2 of the bottom electrode 65 is preferably larger than a thickness m of the bottom electrode 65 in the film thickness direction. For example, the width d2 of the bottom electrode 65 is 2 μm and the thickness m is about 1.1 μm. Thereby, since the area of the bottom electrode 65 facing the gate electrodes 60 is reduced, it is possible to reduce the parasitic capacitance Cgs. As a result, it is possible to further reduce the input capacity Ciss. The gate electrode 60 extends downwardly beyond the interface (the PN junction) between the base region 30 and the drift region 20. For example, a position of the upper surface of the bottom electrode 65 is set to be substantially the same or to be lower than a position of the interface between the base region 30 and the drift region 20. As a specific example, the depth of the recess 25 is about 5 μm, the film thickness of the base region 30 is about 4 μm, and the thickness m of the bottom electrode 65 is about 1.1 μm. Since the bottom electrode 65 does not thickly fill in the wide recess 25, it is possible to shorten the time of the formation process of the bottom electrode 65. Thereby, it is possible to reduce the manufacturing cost.

Also, the width d2 of the bottom electrode 65 is preferably larger than an interval D between the bottom electrode 65 and the gate electrode 60. Thereby, it is possible to broaden the depletion layer, which is broadened from the interface between the recess 25 and the drift region 20, favorably and smoothly by the gate electrode 60 and the bottom electrode 65. As a result, the withstanding voltage of the semiconductor device 1 is improved.

A ratio of the width d2 of the bottom electrode 65 and the interval W2 between the recesses 25 is preferably about 1/4 to 11/4. When the ratio is smaller than 1/4, the holes are difficult to be accumulated in the drift region 20. On the other hand, when the ratio is larger than 11/4, the channel resistance is increased and the on-resistance is increased.

For example, in the semiconductor device 1 having the withstanding voltage of 600V, the width W1 of the recess 25 is about 8 μm in the mask size and the interval W2 between the recesses 25 is about 4 μm. The film thickness t2 of the insulation film 50 on the side surface of the recess 25 is 0.15 μm, the width d1 of the gate electrode 60 is 1.1 μm, the width d2 of the bottom electrode 65 is 2 μm and the interval D between the bottom electrode 65 and the gate electrode 60 is about 2 μm. In the semiconductor device 1 having the withstanding voltage of 1,200V, the width W1 of the recess 25 is about 11 μm in the mask size, and the width d2 of the bottom electrode 65 can be made to be larger, as compared to the semiconductor device 1 having the withstanding voltage of 600V.

As shown in FIGS. 6, 12 and the like, the position of the bottom surface of the gate electrode 60 is preferably lower than the position of the upper surface of the bottom electrode 65. In contrast, in order to arrange the bottom electrode 65 at a position lower than the gate electrode 60, it is necessary to form the recess 25 more deeply. Thereby, the manufacturing time is prolonged. Also, when the recess 25 is deeply formed, it is not possible to form the bottom electrode 65 on the wall surface of the recess 25 so that it favorably faces the drift region 20. Thereby, it is not possible to secure the sufficient withstanding voltage or it is required to thicken the film thickness so as to secure the flatness.

Accordingly, it is preferably to form the gate electrode 60 so that the position of the bottom surface thereof is lower than the position of the upper surface of the bottom electrode 65. Thereby, it is possible to solve the above problems. Further, more preferably, the gate electrode 60 reaches the bottom surface of the recess 25. Thereby, the holes are easily accumulated in the bottom part of the recess 25. The depth of the recess 25 is about 5 μm, for example.

In the meantime, as shown in FIG. 12A, the length of the recess 25 in the extension direction is equal to or larger than the width of the recess 25, as viewed from the plan view.

Figure 13:
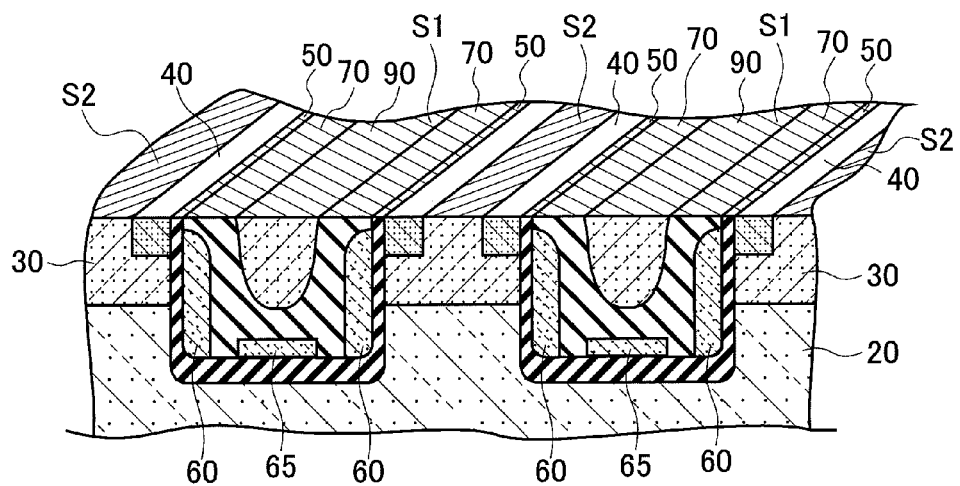
FIG. 13 is a schematic perspective view illustrating an arrangement example of an emitter region of the semiconductor device according to the second illustrative embodiment of this disclosure.
Figure 14:
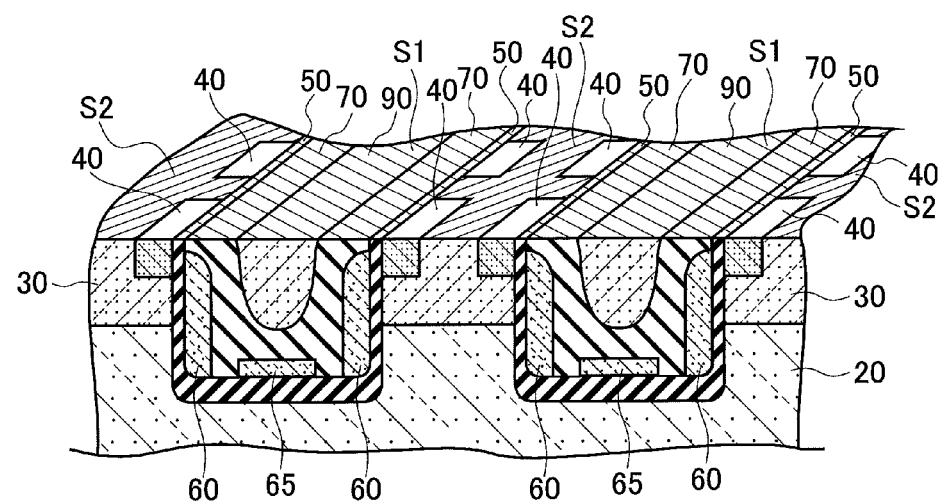
FIG. 14 is a schematic perspective view illustrating another arrangement example of an emitter region of the semiconductor device according to the second illustrative embodiment of this disclosure.

The simulation results shown in FIGS. 8A and 10A and the relation equation of the ratio W1/W3 are obtained for the structure where the emitter region 40 is continuously formed along the recess 25, as shown in FIG. 13. However, as shown in FIG. 14, the emitter region 40 may be dispersedly arranged at an upper part of the base region 30 along the recess 25. In the structure of FIG. 14, a total area of the base region 30 and emitter region 40 contacting the emitter electrode 90 replaces the interval W2, and a total area of the recess 25 facing the emitter electrode 90 at the interface between the drift region 20 and the base region 30 replaces the width W1 of the recess 25. That is, as viewed from the plan view, the area of the recess 25 is preferably larger than the area of the semiconductor region between the recesses 25. Further, an area of the bottom electrode 65 facing the bottom surface of the recess 25 is larger than an area of the gate electrode 60 facing the bottom surface of the recess 25.

Also, the relation of the ratio W1/W3 of the width W1 of the recess 25 to the width W3 is replaced with a ratio (hereinafter, referred to as 'area ratio S') of a total area of the recess 25 facing the emitter electrode 90 at the same plane level as the interface between the drift region 20 and the base region 30 to a total area of the region of the base region 30 contacting the emitter electrode 90.

In FIGS. 13 and 14, a region 51 of the recess 25 facing the emitter electrode 90 and a region S2 of the base region 30 facing the emitter electrode 90 are hatched. That is, the region 51 is a region of the insulation film 50, the interlayer insulation film 70 and the emitter electrode 90 in the recess 25, as viewed from the plan view. The region S2 is a region of the base region 30 exposed on the surface of the semiconductor substrate 100, as viewed from the plan view.

The area ratio S of the total area of the region 51 to the total area of the region S2 is 1 or larger, preferably 1 or larger and 6 or smaller. Also, the area ratio S is more preferably 1.5 or larger and 5 or smaller, most preferably, 1.7 or larger and 2 or smaller.

Figure 15:
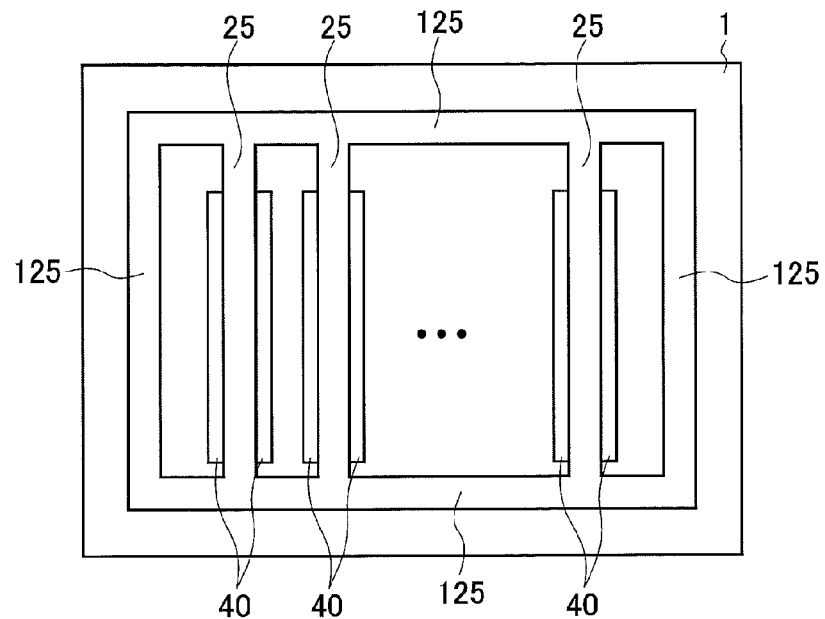
FIG. 15 is a schematic plan view illustrating an arrangement example of a recess and a connection recess of the semiconductor device according to the second illustrative embodiment of this disclosure.

For the semiconductor device 1, it is possible to adopt a structure where a plurality of the recesses 25 is arranged in parallel, as shown in a plan view of FIG. 15. The recess 25 of FIG. 15 is schematically shown, including the insulation film 50, the gate electrodes 60, the bottom electrode 65 and the interlayer insulation film 70 arranged in the recess 25. The emitter regions 40 are arranged at both sides of the recess 25. In the meantime, the emitter electrode 90 and the like are not shown.

As shown in FIG. 15, the semiconductor device 1 includes connection recesses 125 having at least an intersection part, which extends in a direction intersecting with the extension direction of the recess 25 and at which the recesses 25 are connected. The connection recess 125 is formed to penetrate the base region 30 so that its tip reaches the drift region 20, like the recess 25. However, unlike the recess 25, the emitter region 40 is not formed at the periphery of an opening of the connection recess 125.

In the meantime, the connection recess 125 shown in FIG. 15 further has a parallel part arranged to be parallel with the recess 25 in the active region. The parallel part is arranged at an outer side of the outermost periphery recess 25. For example, the connection recess 125 is arranged along an outer edge of the chip. In FIG. 15, an example where the parallel part is arranged one by one at the outer sides of the recesses 25 is shown. However, a plurality of the connection recesses 125 may be arranged at the outer sides of the recesses 25 so that they are parallel with the recesses 25.

As described above, the connection recess 125 of which extension direction intersects with the recess 25 is arranged, so that it is possible to improve an in-plane stress balance of the chip. Also, the connection recess 125 is arranged, so that it is possible to more accumulate the holes moving from the collector region 10 to the drift region 20 at an inner side of the connection recess 125 than at an outer side of the connection recess 125.

Figure 16:
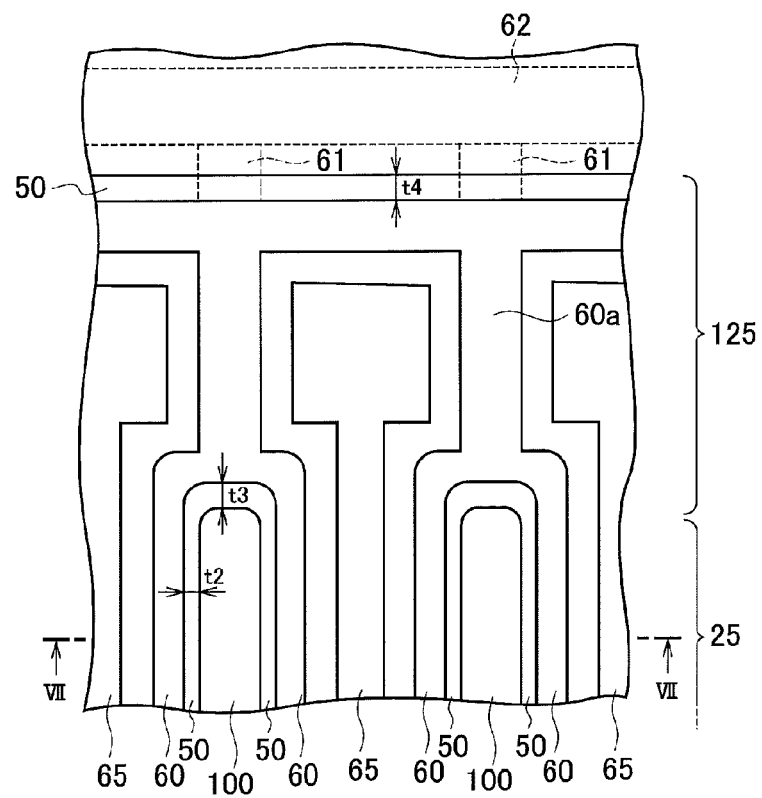
FIG. 16 is a schematic plan view illustrating a structure of a connection part of the recess and the connection recess of the semiconductor device according to the second illustrative embodiment of this disclosure.

As shown in FIG. 15, the recess 25 is connected at both ends thereof to the connection recess 125. An enlarged plan view of a connection part of the connection recess 125 and the recess 25 is shown in FIG. 16. In FIG. 16, the interlayer insulation film 70 and the emitter electrode 90 are not shown. Meanwhile, FIG. 6 is a sectional view taken along a direction VII-VII of FIG. 16.

By a conductive film arranged in the connection recess 125, the gate electrodes 60 arranged in the plurality of recesses 25 arranged in parallel are connected each other. Specifically, extension parts 60a from the gate electrodes 60 formed in the recesses 25 are also continuously formed in the connection recesses 125. The gate electrodes 60 formed in each of a pair of recesses 25 facing each other with the semiconductor regions (the base region 30 and the emitter region 40) being interposed therebetween are first connected by the extension parts 60a formed in the connection recess 125. Since the extension parts 60a are continuously arranged in the connection recess 125, the gate electrodes 60 formed in the respective recesses 25 of the semiconductor device 1 are electrically connected each other.

Also, as shown in FIG. 16, an end portion of the bottom electrode 65 in the connection recess 125 is formed to be wider than the other region. By the wider end portion, the bottom electrode 65 and the emitter electrode 90 are connected.

Like the recess 25, the insulation film 50 is arranged on an inner wall surface of the connection recess 125, and the extension part 60a from the gate electrodes 60 and the bottom electrode 65 are arranged on the insulation film 50. Therefore, it is possible to form the connection recess 125 at the same time in the process of forming the recess 25.

In the meantime, a width of the connection recess 125 may be narrower than the width of the recess 25. Since the emitter region 40 is not arranged at the periphery of the opening of the connection recess 125, a channel is not formed. By narrowing the width of the connection recess 125, the accumulation of the holes in a bottom surface of the connection recess 125 and in the vicinity of the bottom surface is reduced, as compared to the bottom surface of the recess 25. Thereby, it is possible to suppress a latch-up phenomenon due to the holes remaining in an outer periphery region of the semiconductor device 1.

On the other hand, the width of the connection recess 125 may be wider than the width of the recess 25. Thereby, it is possible to further improve the in-plane stress balance of the chip.

In the meantime, a recess side surface in the connection region where the recess 25 and the connection recess 125 are connected is curved. The connection region is curved, so that it is possible to smoothly broaden the depletion layer. In the meantime, a film thickness t3 of the insulation film 50 in the connection region may be formed to be thicker than the film thickness t2 of the region functioning as the gate insulation film. Thereby, the withstanding voltage of the outer periphery region surrounding the active region in which the semiconductor device is formed becomes higher than the withstanding voltage of the active region. As a result, a breakdown is likely to occur in the active region, so that it is possible to prevent the breaking of the semiconductor device 1 by suppressing the current concentration.

Also, a film thickness t4 of the insulation film 50 formed on the sidewall surface of the connection recess 125 may be thicker than the film thickness t2 in the active region. Thereby, it is possible to make the withstanding voltage of the outer periphery region higher than that of the active region.

In the meantime, regarding the film thickness of the insulation film 50, when the film thickness t1 of the region arranged on the bottom surface of the recess 25 is formed to be thicker than the film thickness t2 on the side surface of the recess 25, the film thickness t3 in the connection region or the film thickness t4 in the connection recess 125 may be formed to be substantially the same as the film thickness t1 so that the film thickness t3 or t4 is thicker than the film thickness t2. That is, the insulation film 50 of the connection region or connection recess 125 is preferably formed concurrently with the region arranged on the bottom surface of the recess 25.

Figure 17:
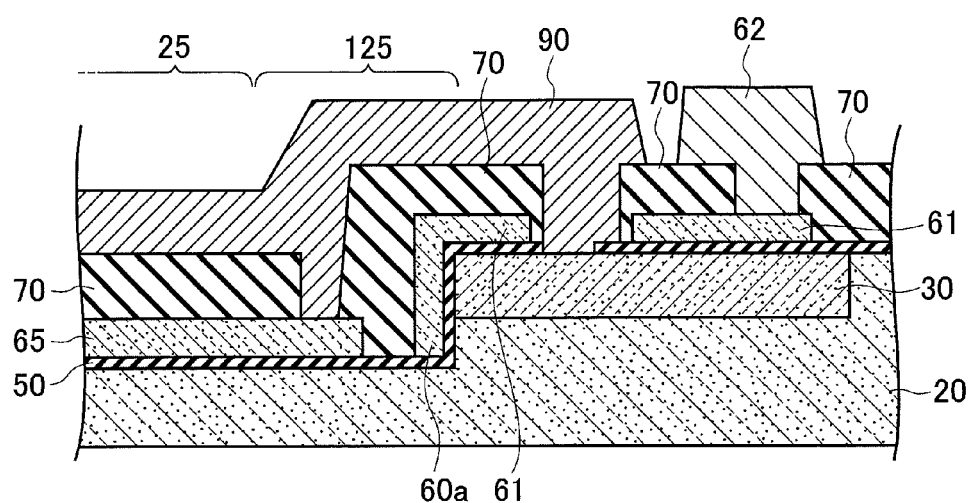
FIG. 17 is a sectional view of the connection part shown in FIG. 16, which is taken along an extension direction of the recess.

FIG. 17 is a sectional view of the connection part of the recess 25 and the connection recess 125. As shown in FIG. 17, the base region 30 may be formed up to the outer side of the connection recess 125. Thereby, it is possible to secure a region capable of securely contacting the base region 30 and the emitter electrode 90, at the outer side of the connection recess 125. The emitter electrode 90 is connected to the base region 30 at the outer side of the connection recess 125, so that it is possible to suppress the accumulation of the holes in the outer periphery region.

In the meantime, the emitter region 40 may not extend to the connection place of the recess 25 and the connection recess 125 because it is not used as the gate region.

Meanwhile, the extension part 60a from the gate electrode 60 is connected to a bus line 62, which is arranged at the chip outer edge from the inside of the connection recess 125, via a connection part 61 arranged on the surface of the semiconductor substrate 100. The connection part 61 arranged on the surface of the semiconductor substrate 100 and the bus line 62 are shown with the broken line in FIG. 16. A predetermined gate voltage can be applied to the gate electrode 60 through the bus line 62.

Although not shown, a variety of withstanding voltage improving structures can be adopted in the outer periphery region at an outer side of the bus line 62. For example, a reduced surface field structure, a field limiting ring (FLR) and the like are arranged in the outer periphery region.

Figure 18:
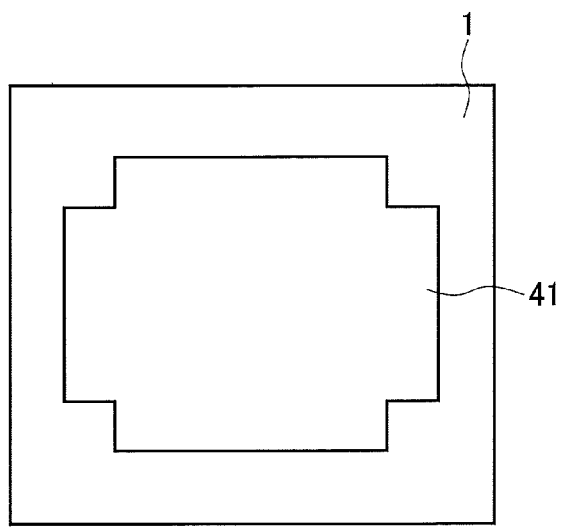
FIG. 18 is a schematic plan view illustrating an arrangement example of an active region of the semiconductor device according to the second illustrative embodiment of this disclosure.

In the meantime, as shown in FIG. 18, it is preferably not to arrange the active region 41 at corner portions of the chip. The holes are likely to be concentrated at the corner portions of the chip. However, when the emitter region 40 is not formed in the corresponding region, the holes can be easily moved out, so that it is possible to suppress the latch-up phenomenon in the outer periphery region.

Figure 19:
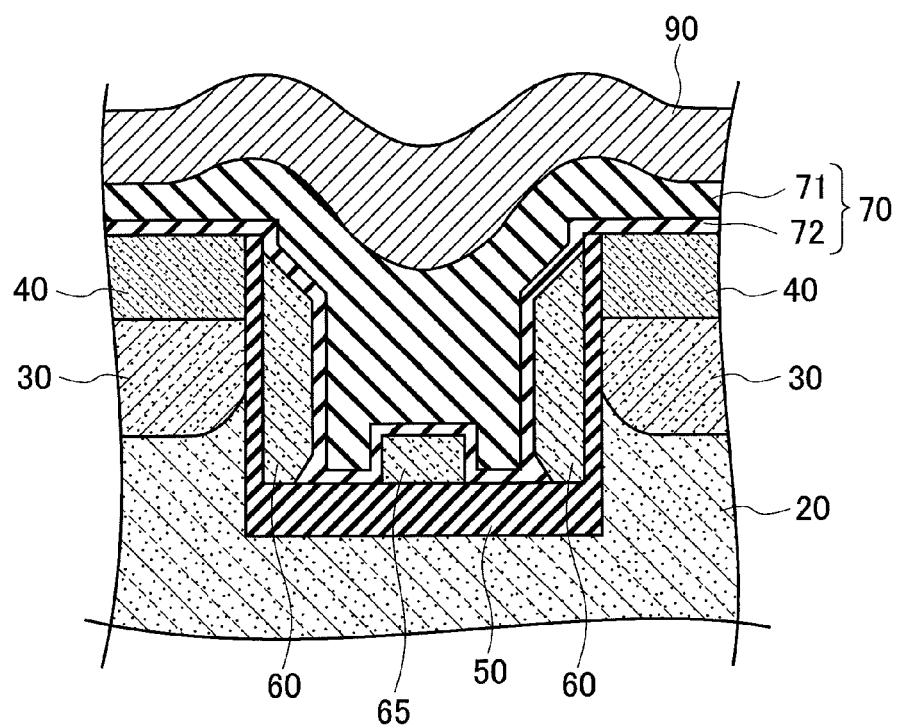
FIG. 19 is a schematic plan view illustrating a structure example of a recess periphery of the semiconductor device according to the second illustrative embodiment of this disclosure.

As shown in FIG. 19, a lower surface of the gate electrode 60 facing the bottom surface of the recess 25 may be tapered. The lower surface of the gate electrode 60 is tapered, so that a facing area between the bottom surface of the gate electrode 60 and the drift region 20 (the collector region 10) is narrowed to reduce the parasitic capacitance Cdg.

Also, since a part of the interlayer insulation film 70 fills the inside of the recess 25, the interlayer insulation film 70 may be formed to be thick at the upper of an edge of the opening of the recess 25 and to be thin at the upper of the center of the opening of the recess 25, as shown in FIG. 19. A large concave portion is formed on the upper surface of the emitter electrode 90 above the center of the opening of the recess 25. For this reason, a connection area between a clip lead and a bonding wire arranged on the upper surface of the emitter electrode 90 and the emitter electrode 90 is increased to improve the connection strength.

When the gate electrode 60 and the bottom electrode 65 are polycrystalline silicon electrodes having a dopant, a stacked structure having a first insulation film 71 consisting of a BPSG film and a second insulation film 72 consisting of an NSG film is preferably adopted for the interlayer insulation film 70, as shown in FIG. 19, for example. Since the BPSG film is an interlayer film of which surface can be smoothed by annealing processing but contains phosphorous (P), it influences the conductivity of the electrode. For this reason, when the NSG film, which is a protection film not containing phosphorous, is arranged between the electrode and the BPSG film, it is possible to smooth the upper surface of the interlayer insulation film 70 without influencing the conductivity of the electrode.

Also, as shown in FIG. 19, the base region 30 may be formed so that a position of the lower surface thereof is shallower in a region adjacent to the recess 25 than in a region separated from the recess 25.

By the above configuration, the film thickness of the drift region 20 is thicker in the region adjacent to the recess 25 than in the region separated from the recess 25 between the adjacent recesses 25, as seen in a vertical direction of FIG. 19, i.e., in the film thickness direction of the drift region 20.

For this reason, the holes accumulated in the bottom part of the recess 25 and the surrounding region thereof can more easily reach the bottom surface of the base region 30 in the region separated from the recess 25 than in the region of the drift region 20 adjacent to the recess 25, so that the movement amount of the holes in the region of the drift region 20 separated from the recess 25 is relatively increased.

Like this, the movement of the holes in the region adjacent to the recess 25 is relatively suppressed, so that the movement amount of the holes moving along the bottom part of the emitter region is reduced. Therefore, it is possible to reduce the latch-up phenomenon.

Further, the holes are more likely to flow in a region of the base region 30 where the impurity concentration is higher. Therefore, in the base region 30, the impurity concentration in the region adjacent to the recess 25 may be formed to be lower than the impurity concentration in the region separated from the recess 25. By this configuration, also in the base region 30, it is possible to suppress the movement of the holes in the region adjacent to the recess 25 and to relatively increase the movement amount of the holes in the region separated from the recess 25. Thereby, since the movement amount of the holes moving along the bottom part of the emitter region is further reduced, it is possible to further reduce the latch-up phenomenon.

Also, seeing the semiconductor device of this disclosure from a sectional view taken along a direction perpendicular to the extension direction of the recess 25, i.e., from FIG. 19, when the gate electrode 60 is tapered from the upper surface towards the bottom surface of the recess 25 so that the interval with the bottom electrode 65 is gradually widened, in the region where the gate electrode 60 faces the bottom electrode 65, it is possible to reduce the parasitic capacitance Cdg while improving the withstanding voltage.

The gate electrode 60 is preferably made to be adjacent to the bottom surface of the recess 25 as much as possible, because the depletion layer is widened at both end portions of the bottom surface of the recess 25. That is, since both end portions of the bottom surface of the recess 25 are the electric field concentration points, the depletion layer is favorably widened at the end portions to improve the withstanding voltage.

On the other hand, when the gate electrode 60 is arranged to be adjacent to the bottom surface of the recess 25, the parasitic capacitance is generated at the corresponding part because the gate electrode 60 faces the bottom electrode 65.

However, since the gate electrode 60 is tapered so that the interval with the bottom electrode 65 is gradually widened, in the region where the gate electrode 60 faces the bottom electrode 65, it is possible to reduce the parasitic capacitance between the gate electrode 60 and the bottom electrode 65, as compared to a structure where the corresponding part is not tapered.

Thereby, it is possible to reduce the parasitic capacitance Cdg while improving the withstanding voltage.

Meanwhile, FIG. 19 exemplifies an example where the film thickness of the insulation film 50 arranged on the bottom surface of the recess 25 is thicker than the film thickness of the insulation film 50 arranged on the side surface of the recess 25 and in the region facing the base region 30. However, regarding the withstanding voltage improvement, the above effects are increased when the film thickness of the insulation film 50 arranged on the bottom surface of the recess 25 becomes thinner, for example when the film thickness of the insulation film 50 arranged on the bottom surface of the recess 25 is formed to be substantially the same as that of the insulation film 50 arranged on the side surface of the recess 25 and in the region facing the base region 30.

In the meantime, an n-type semiconductor region having a higher impurity concentration than the drift region 20 may be arranged between the drift region 20 and the base region 30. The semiconductor region having a higher impurity concentration is arranged, so that the holes are more accumulated in the drift region 20 in the vicinity of the interface with the drift region 20 below the semiconductor region. As a result, it is possible to further reduce the on-resistance.

As described above, according to the semiconductor device 1 of the second illustrative embodiment of this disclosure, the width W1 of the recess 25 in which the gate electrodes 60 are formed is set to be wide and the interval W2 between the recesses 25 is set to be equal to or smaller than the width W1 of the recess 25. For this reason, the holes are likely to be accumulated in the vicinity of the bottom part of the recess 25. As a result, it is possible to provide the semiconductor device having the high withstanding voltage and low on-voltage.

Other Illustrative Embodiments

Although the illustrative embodiments have been described, it should be understood that the descriptions and drawings configuring the parts of the disclosure of the illustrative embodiments do not limit this disclosure. From the disclosure, a variety of alternative illustrative embodiments, operating technologies and the like are obvious to one skilled in the art.

For example, the bottom part of the recess 25 may be formed to be thinner at the central part than at the end portions. When the bottom part of the recess 25 is formed in this way, it is possible to accumulate the holes at the central part of the bottom part of the recess 25 more efficiently. As a result, it is possible to lower the on-voltage.

Alternatively, the recess 25 may be formed to be round so that at least a part of the bottom part is convex downwardly. When the roundness is large at the end portions of the bottom part of the recess 25, the holes are likely to move to the base region 30 without being accumulated below the recess 25. For this reason, when the bottom part of the recess 25 is flat or the upwardly convex part thereof is wide, it is possible to lower the on-voltage.

Like this, this disclosure includes a variety of illustrative embodiments and the like that are not described in the specification. Therefore, the technical scope of this disclosure is defined by the invention specific configurations relating to the claims valid from the above descriptions.

What is claimed is:

1. A semiconductor device comprising:
a first semiconductor region, which has a first conductivity type;
a second semiconductor region, which has a second conductivity type and is arranged on the first semiconductor region;
a third semiconductor region, which has the first conductivity type and is arranged on the second semiconductor region;
a fourth semiconductor region, which has the second conductivity type and is arranged on the third semiconductor region;
an insulation film, which is arranged on an inner wall of a recess extending from an upper surface of the fourth semiconductor region and penetrate the fourth semiconductor region and the third semiconductor region to reach the second semiconductor region;
a control electrode, which is arranged on a region of the insulation film on a side surface of the recess, the region facing a side surface of the third semiconductor region;
a first main electrode, which is electrically connected to the first semiconductor region;
a second main electrode, which is electrically connected to the fourth semiconductor region; and
a bottom electrode, which is arranged on the insulation film with being separated from the control electrode on a bottom surface of the recess and is electrically connected to the second main electrode,
wherein a length of the recess in an extension direction thereof is equal to or larger than a width of the recess, and the width of the recess is wider than an interval between the adjacent recesses, as viewed from a plan view.

2. The semiconductor device according to claim 1,
wherein a width of the bottom electrode facing the bottom surface of the recess is wider than a width of the control electrode facing the bottom surface of the recess.

3. The semiconductor device according to claim 1,
wherein a width of the bottom electrode facing the bottom surface of the recess is larger than a thickness of the bottom electrode in a film thickness direction.

4. The semiconductor device according to claim 1,
wherein a position of a lower surface of the control electrode is lower than a position of an upper surface of the bottom electrode.

5. The semiconductor device according to claim 1,
wherein a width of the bottom electrode facing the bottom surface of the recess is larger than an interval between the bottom electrode and the control electrode along the bottom surface of the recess.

6. The semiconductor device according to claim 1,
wherein a width of the recess is larger than a depth of the recess and is 3 to 20 μm.

7. The semiconductor device according to claim 1, further comprising:
a connection recess, which has at least an intersection part formed to penetrate the third semiconductor region and to reach the second semiconductor region and extending in a direction intersecting with an extension direction of the recess, the recess being connected at the intersection part,
wherein the control electrodes arranged in a plurality of recesses arranged in parallel are connected each other by a conductive film arranged in the connection recess.

8. The semiconductor device according to claim 7,
wherein the connection recess further has a parallel part arranged in parallel with the recess.

9. The semiconductor device according to claim 7,
wherein a width of the connection recess is narrower than a width of the recess.

10. The semiconductor device according to claim 7,
wherein a width of the connection recess is wider than a width of the recess.

11. The semiconductor device according to claim 1,
wherein a width of the recess is 3 μm to 15 μm,
wherein a depth of the recess is 2 μm to 10 μm,
wherein a thickness of the second semiconductor region is 40 μm to 140 μm and a specific resistance of the second semiconductor region is 10 Ωcm to 150 Ωcm.

12. A semiconductor device comprising:
a first semiconductor region, which has a first conductivity type;
a second semiconductor region, which has a second conductivity type and is arranged on the first semiconductor region;
a third semiconductor region, which has the first conductivity type and is arranged on the second semiconductor region;
a fourth semiconductor region, which has the second conductivity type and is arranged on the third semiconductor region;
an insulation film, which is arranged on an inner wall of a recess extending from an upper surface of the fourth semiconductor region and penetrates the fourth semiconductor region and the third semiconductor region to reach the second semiconductor region;
a control electrode, which is arranged on a region of the insulation film on a side surface of the recess, the region facing a side surface of the third semiconductor region;
a bottom electrode, which is arranged on the insulation film with being separated from the control electrode on a bottom surface of the recess;
a first main electrode, which is electrically connected to the first semiconductor region;
an interlayer insulation film arranged on the control electrode and the bottom electrode; and
a second main electrode, which is arranged on the third semiconductor region and the fourth semiconductor region, above the control electrode and the bottom electrode, with interposing the interlayer insulation film, and electrically connected to the fourth semiconductor region and the bottom electrode,
wherein an area of the recess is larger than an area of a semiconductor region between the adjacent recesses, as viewed from a plan view.

13. The semiconductor device according to claim 12,
wherein an area of the bottom electrode facing the bottom surface of the recess is larger than an area of the control electrode facing the bottom surface of the recess.

* * * * *